United States Patent
Gosain et al.

(10) Patent No.: US 6,285,055 B1
(45) Date of Patent: Sep. 4, 2001

(54) MEMORY DEVICE AND METHOD OF MANUFACTURING THE SAME, AND INTEGRATED CIRCUIT AND METHOD OF MANUFACTURING SEMICONDUCTOR DEVICE

(75) Inventors: Dharam Pal Gosain; Kazumasa Nomoto; Jonathan Westwater; Miyako Nakagoe; Setsuo Usui; Takashi Noguchi; Yoshifumi Mori, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/381,987

(22) PCT Filed: Jan. 26, 1999

(86) PCT No.: PCT/JP99/00313

§ 371 Date: Nov. 29, 1999

§ 102(e) Date: Nov. 29, 1999

(87) PCT Pub. No.: WO99/38213

PCT Pub. Date: Jul. 29, 1999

(30) Foreign Application Priority Data

Jan. 26, 1998 (JP) .................................................. 10-27747
Oct. 28, 1998 (JP) .................................................. 10-321377

(51) Int. Cl.$^7$ .......................... H01L 29/788; H01L 33/00
(52) U.S. Cl. .......................... 257/317; 257/315; 438/263; 438/260
(58) Field of Search .................................. 257/315, 317; 438/263, 260

(56) References Cited

U.S. PATENT DOCUMENTS

| | | |
|---|---|---|
| 4,047,974 | 9/1977 | Harai . |
| 5,017,505 | * 5/1991 | Fujii et al. . |
| 5,357,134 | 10/1994 | Shimoji . |
| 5,466,626 | * 11/1995 | Armacost et al. . |
| 5,633,178 | 5/1997 | Kalnitsky . |
| 5,828,084 | 10/1998 | Takashi . |
| 5,880,991 | * 3/1999 | Hsu et al. . |

FOREIGN PATENT DOCUMENTS

| | | |
|---|---|---|
| 0366146 | 5/1990 | (EP) . |
| 57-026469 | 2/1982 | (JP) . |
| 61-046058 | 3/1986 | (JP) . |
| 62-023173 | 1/1987 | (JP) . |
| 05211339 | 8/1993 | (JP) . |
| 09008319 | 1/1997 | (JP) . |

OTHER PUBLICATIONS

"Electrochemical and In–situ XRD Characterization of Lini02 and Lico0. 2Ni0.802 Electrodes for Rechargeable Lithium Cells", by E. Levi et al; vol. 1999, No. 09; Nov. 1999, pp. 97–108.

(List continued on next page.)

Primary Examiner—Stephen D. Meier
(74) Attorney, Agent, or Firm—Sonnenschein, Nath & Rosenthal

(57) ABSTRACT

While a storage region 15 has of many dispersed particulates (dots) (15a), the surface density of the particulates (15a) is set to be higher than that of structural holes (pin holes) produced in a tunnel insulating film (14a), or the number of the particulates (15a) in the storage region (15) is set to five or more. While a conduction region (13c) is formed by a polysilicon layer (13) having a surface roughness of 0.1 nm to 100 nm, the number of the particulates (15a) in the storage region (15) is set to be larger than the number of crystal grains in the conduction region (13c). Even when a defect such as a pin hole occurs in the tunnel insulating film (14a) and charges stored in a part of the particulates are leaked, the charges stored in the particulates formed in a region where no defect occurs are not leaked. Thus, information can be held for a long time.

38 Claims, 25 Drawing Sheets

OTHER PUBLICATIONS

Patent Abstracts of Japan, JP 09–260611 dated Oct. 3, 1997.
Patent Abstracts of Japan, JP 57–26469 dated Feb. 12, 1982.
Patent Abstracts of Japan, JP 61–46058 dated Mar. 6, 1986.
Patent Abstracts of Japan, JP 04–25181 dated Jan. 28, 1992.
Patent Abstracts of Japan, JP 05–211339 dated Aug. 20, 1993.
Patent Abstracts of Japan, JP 62–23173 dated Jan. 31, 1987.
Patent Abstracts of Japan, JP 10–65024 dated Mar. 6, 1998.
Patent Abstracts of Japan, JP 10–112440 dated Apr. 28, 1998.

* cited by examiner

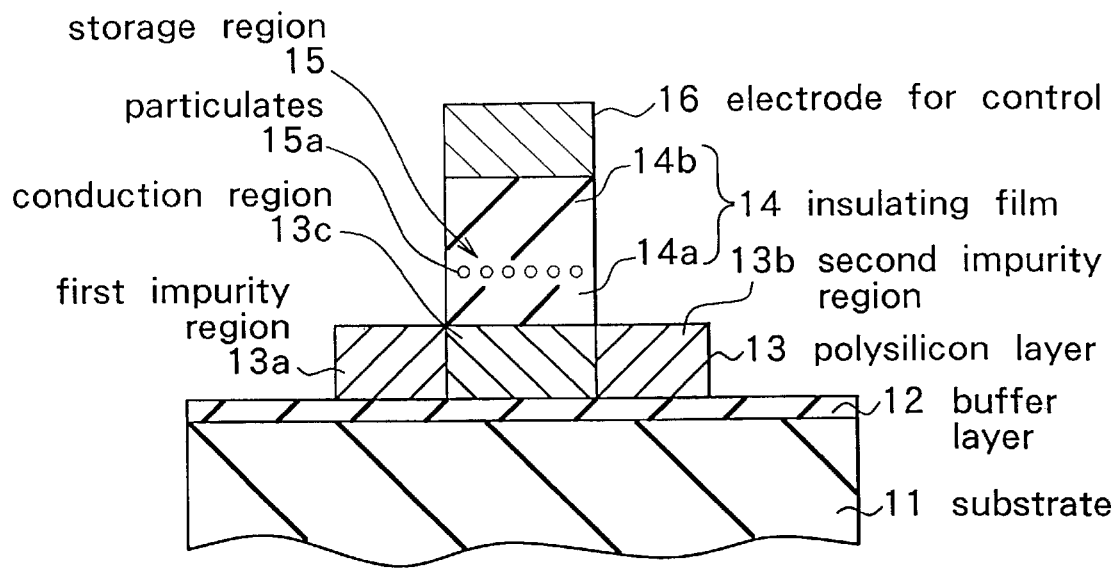
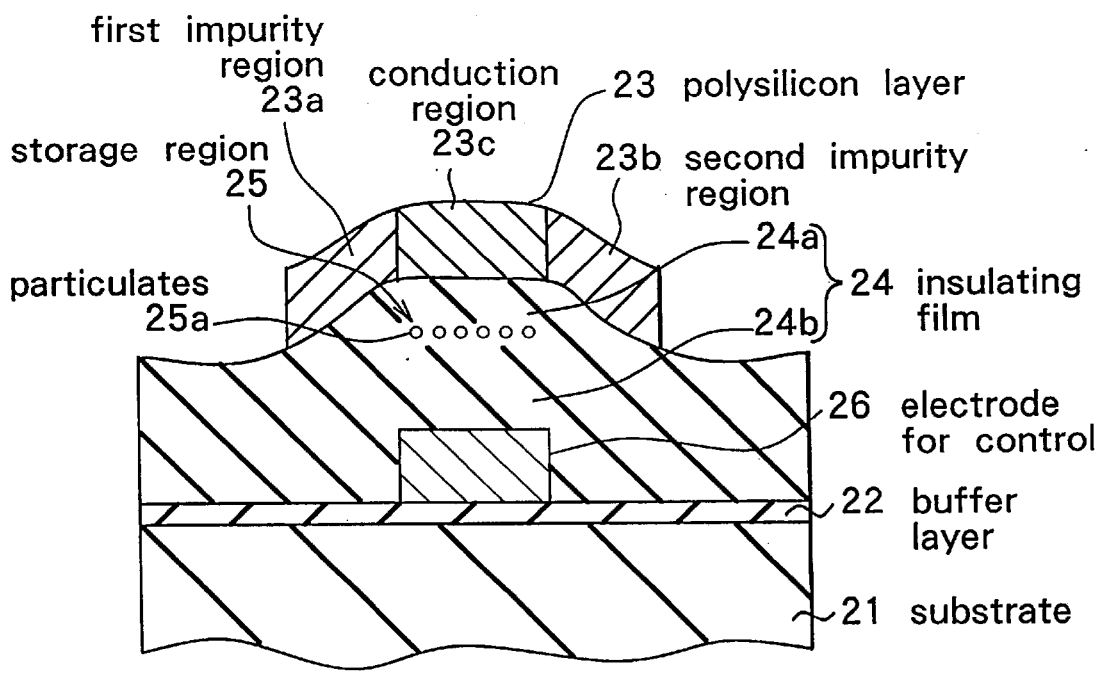

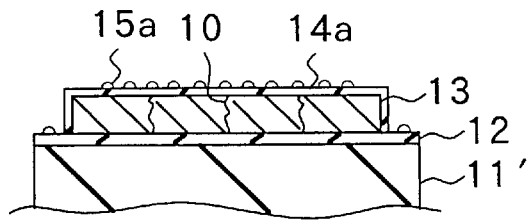
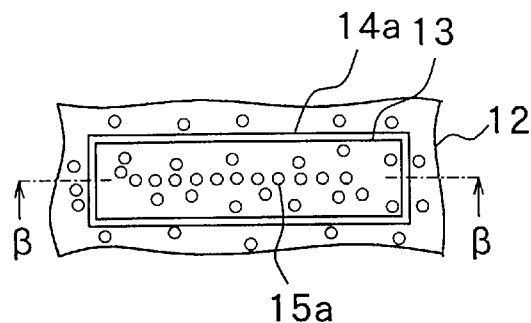
FIG.12A    FIG.12B
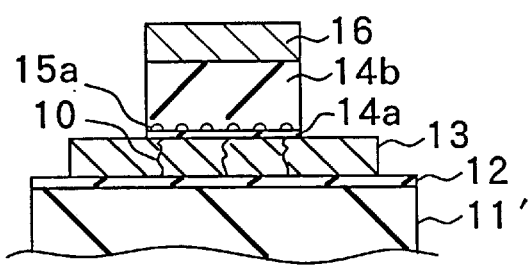
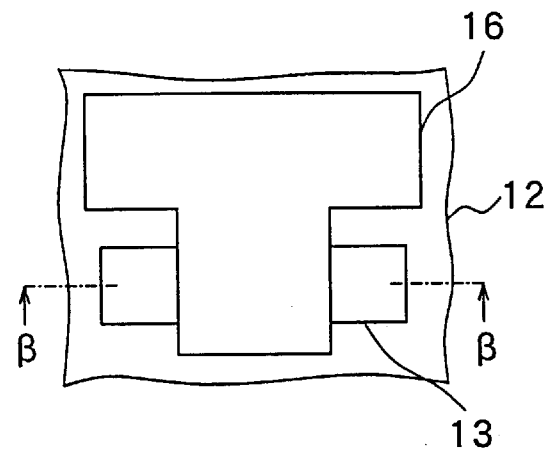
FIG.13A    FIG.13B
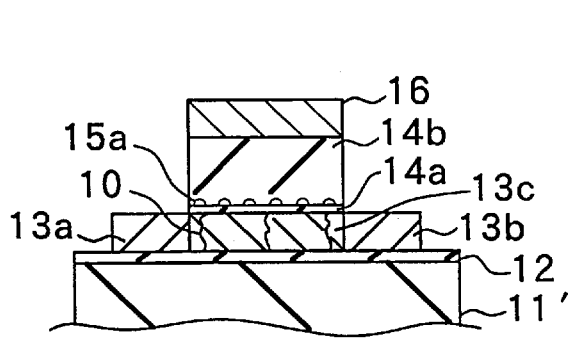
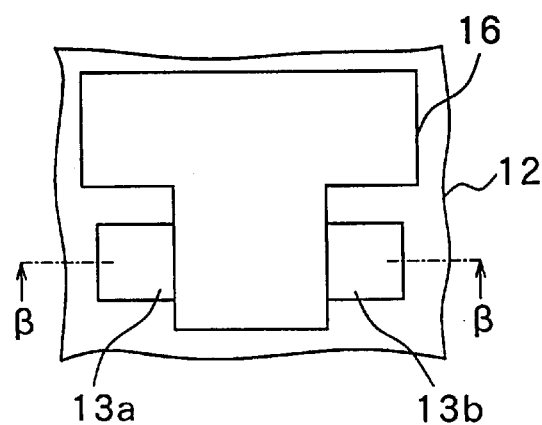
FIG.14A    FIG.14B

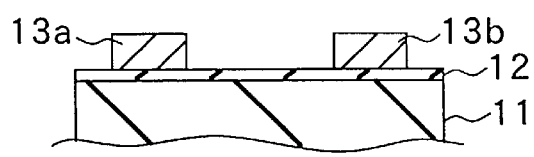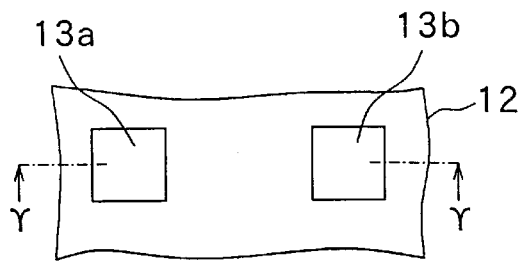
FIG.16A  FIG.16B
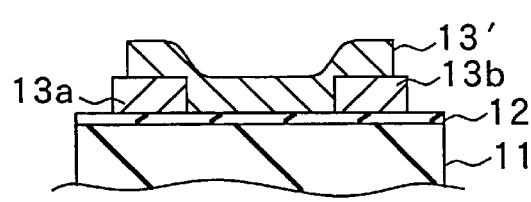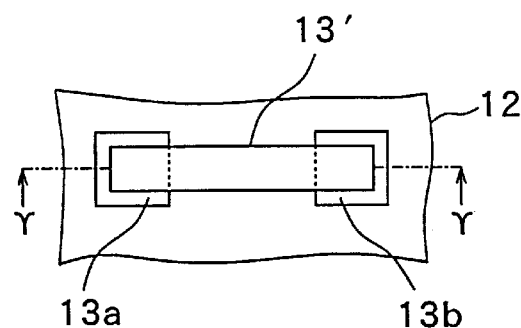
FIG.17A  FIG.17B
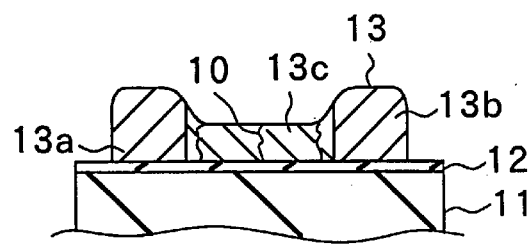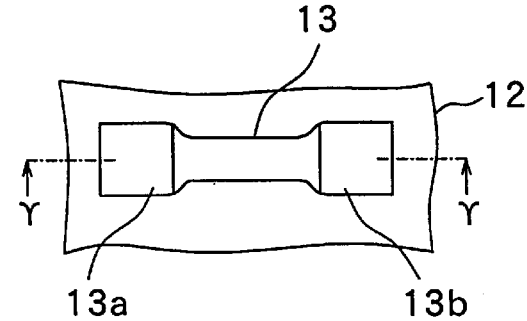
FIG.18A  FIG.18B

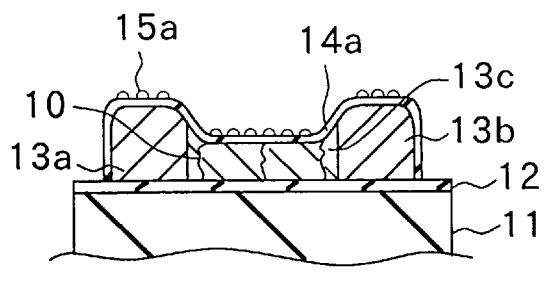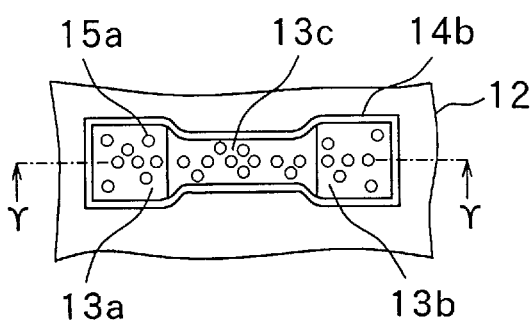
FIG.19A  FIG.19B
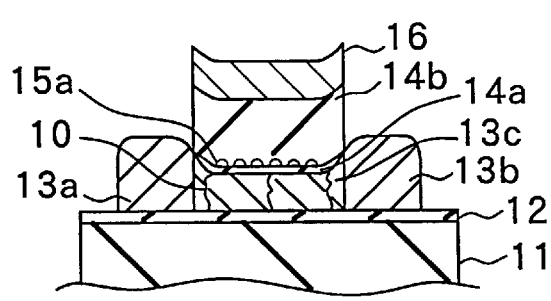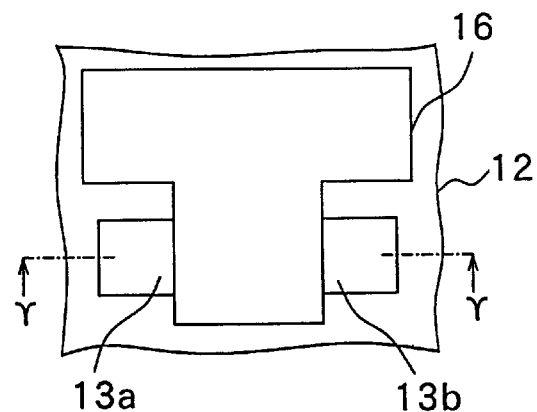
FIG.20A  FIG.20B

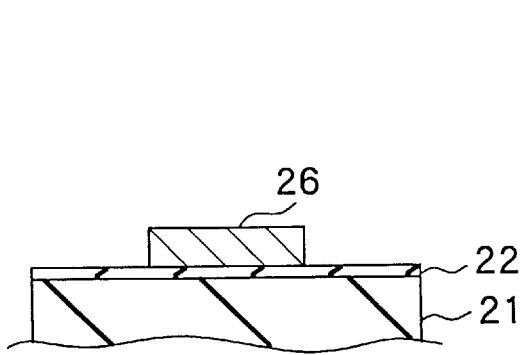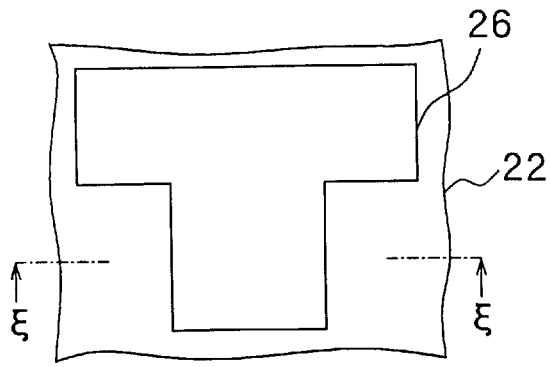
FIG.21A  FIG.21B
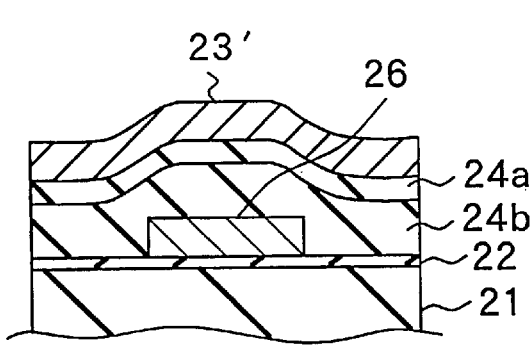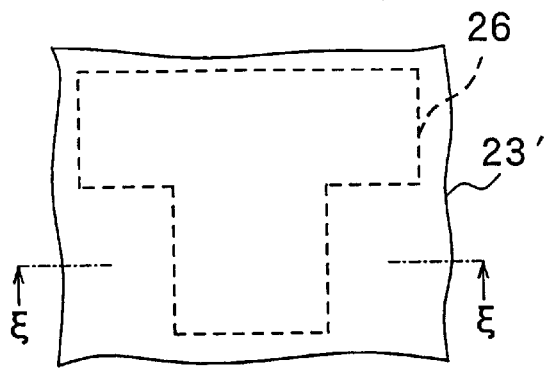
FIG.22A  FIG.22B
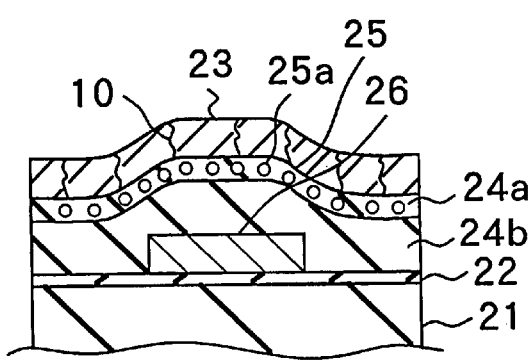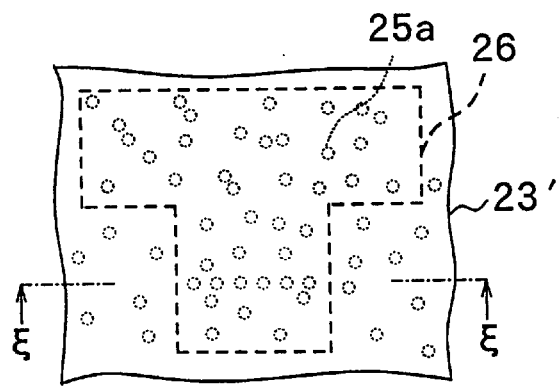
FIG.23A  FIG.23B

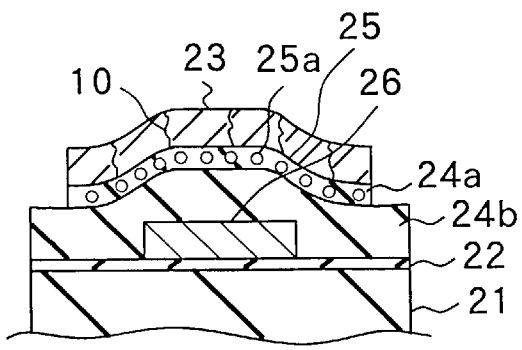
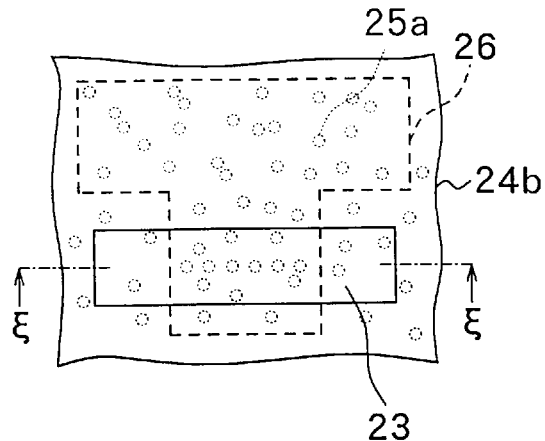
FIG.24A  FIG.24B
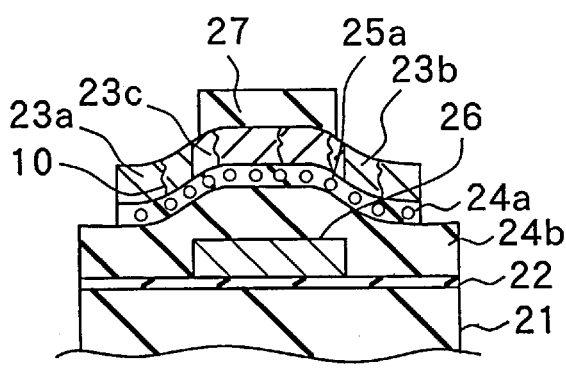
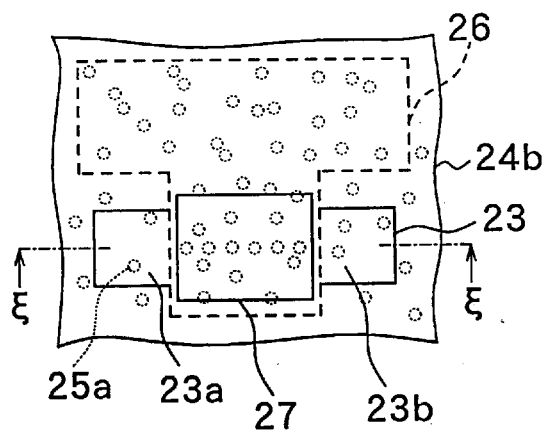
FIG.25A  FIG.25B

MEMORY DEVICE AND METHOD OF MANUFACTURING THE SAME, AND INTEGRATED CIRCUIT AND METHOD OF MANUFACTURING SEMICONDUCTOR DEVICE

BACKGROUND OF THE INVENTION

1. Technical Field

The present invention relates to a memory device for holding information by storing charges moved from a conduction region into a storage region and a method of manufacturing the memory device, and a method of manufacturing an integrated circuit and a semiconductor device in which memory device are integrated. More particularly, the invention relates to a memory device in which a storage region comprises a plurality of particulates (quantum dots), a method of manufacturing the memory device, and a method of manufacturing an integrated circuit and a semiconductor device.

2. Background Art

In a non-volatile memory typified by an EEPROM (Electric Erasable-Programmable Read Only Memory), a storage region is formed on a conduction region formed on the surface of a single crystal silicon substrate with an insulating film in between. Charges moved from the conduction region by tunneling the insulating film are stored into the storage region, thereby information is held in a non-volatile memory. Hitherto, the storage region is formed by using a two-dimensionally spread continuous semiconductor film. In a conventional non-volatile memory, in order to hold charges stored in the storage region for a long time, a thermal oxide film made of silicon having excellent insulating properties is used as an insulating film between the conduction region and the storage region. The thermal oxide film is prepared by heating a single crystal silicon substrate to 800 to 1000° C. in an oxygen atmosphere. The silicon substrate is not deformed nor melt around this temperature. Since the thermal oxide film formed on the single crystal silicon substrate has excellent insulating properties, charges are not leaked from the two-dimensionally continued storage region and are stably held.

As described above, in the conventional memory device, in case of using the thermal oxide film as an insulating film between the conduction region and the storage region, the substrate has to be heated to a high temperature of 800 to 1000° C. When the substrate is made of glass or plastic material instead of single crystal silicon, however, such high-temperature heat treatment cannot be performed. For example, the temperature at which a glass substrate is deformed is 500° C. The temperature at which a plastic substrate is deformed is at most 200° C. even when the substrate is made of a heat resistant material. When the substrate is made of glass or plastic, therefore, the insulating film between the conduction region and the storage region has to be prepared in low-temperature conditions of 500° C. or lower.

When the oxide film is prepared at a low temperature of 500° C. or lower, however, defects, or a number of structural holes (pin holes) occur in the oxide film. These pin holes let the charges stored in the two-dimensionally spread storage region to be leaked to the conduction region in a short time and cause a problem that information cannot be held for a long time.

On the other hand, although an oxide film such as a silicon oxide film ($SiO_2$) on the silicon substrate is resistant to heat of high temperature, the conduction region on the oxide film is made of polysilicon and the surface of polysilicon is rough. Due to the roughness of the polysilicon, concentration of an electric field occurs in the insulating film provided on the polysilicon, which causes a problem that the charges in the two-dimensionally continued storage region are also leaked from the position where concentration of an electric field occurs.

SUMMARY OF THE INVENTION

It is an object of the present invention to provide a memory device which can be fabricated at a low temperature on a substrate made of glass or plastic and can hold information for a long time and a method of manufacturing the memory device, and a method of manufacturing an integrated circuit and a semiconductor device.

According to the invention, there is provided a memory device comprising: a conduction region made of a polycrystalline semiconductor; a first impurity region provided adjacent to the conduction region; a second impurity region provided apart from the first impurity region and adjacent to the conduction region; a storage region comprised of a plurality of dispersed particulates, for storing charges moved from the conduction region; a tunnel insulating film provided between the storage region and the conduction region, through which charges can pass; a control electrode for controlling each of a charge quantity of the storage region and conductivity of the conduction region; and a control insulating film provided between the control electrode and the storage region, wherein that of the particulates in the storage region is higher than that of structural holes (pin holes) produced in the tunnel insulating film.

According to the invention, there is provided another memory device comprising: a conduction region made of a polycrystalline semiconductor; a first impurity region provided adjacent to the conduction region; a second impurity region provided apart from the first impurity region and adjacent to the conduction region; a storage region comprised of a plurality of dispersed particulates, for storing charges moved from the conduction region; a tunnel insulating film provided between the storage region and the conduction region, through which charges can pass; a control electrode for controlling each of a charge quantity of the storage region and conductivity of the conduction region; and a control insulating film provided between the control electrode and the storage region, wherein the number of the particulates in the storage region is five or more.

According to the invention, there is provided further another memory device comprising: a conduction region made of a polycrystalline semiconductor; a first impurity region provided adjacent to the conduction region; a second impurity region provided apart from the first impurity region and adjacent to the conduction region; a storage region comprised of a plurality of dispersed particulates, for storing charges moved from the conduction region; a tunnel insulating film provided between the storage region and the conduction region, through which charges can pass; a control electrode for controlling each of a charge amount of the storage region and conductivity of the conduction region for memory; and a control insulating film provided between the control electrode and the storage region, wherein the conduction region is formed by a polysilicon film having a surface roughness of 0.1 nm to 100 nm and the number of particulates in the storage region is larger than that of crystal grains in the conduction region.

According to the invention, there is provided an integrated circuit comprising a plurality of memory device, wherein each of the memory device comprises: a conduction region made of a semiconductor; a source region provided adjacent to the conduction region; a drain region provided apart from the source region and adjacent to the conduction region; a storage region comprised of a plurality of dispersed particulates, for storing charges moved from the conduction region; a tunnel insulating film which is provided between the storage region and the conduction region, through which charges can pass; a control electrode for controlling a charge quantity of the storage region and the conductivity of the conduction region; and a control insulating film provided between the control electrode and the storage region; and has the structure such that the surface density of the particulates in the storage region is higher than that of structural holes (pin holes) produced in the tunnel insulating film, the control electrode of each of the memory device is connected to a word line, and a source-drain path of each memory device is connected between a bit line and a source line.

A method of manufacturing a memory device according to the invention comprises: a step of forming a conduction region by a semiconductor film on a substrate made of an insulating material; a step of forming a tunnel insulating film on the conduction region; a step of forming a storage region comprised of a plurality of particulates dispersed on the tunnel insulating film, with the surface density of the particulates being higher than that of structural holes (pin holes) in the tunnel insulating film; a step of forming a control insulating film on the storage region; a step of forming a control electrode on the control insulating film; and a step of forming a first impurity region adjacent to the conduction region, and a second impurity region apart from the first impurity region and adjacent to the conduction region.

Another method of manufacturing a memory device according to the invention comprises: a step of forming a conduction region made by a semiconductor film on a substrate made of an insulating material; a step of forming a tunnel insulating film on the conduction region; a step of forming a storage region having five or more particulates dispersed on the tunnel insulating film; a step of forming a control insulating film on the storage region; a step of forming a control electrode on the control insulating film; and a step of forming a first impurity region adjacent to the conduction region and a second impurity region apart from the first impurity region and adjacent to the conduction region.

Further another method of manufacturing a memory device according to the invention comprises: a step of forming a conduction region, made by a polysilicon film whose surface roughness is 0.1 nm to 100 nm, on a substrate made of an insulating material; a step of forming a tunnel insulating film on the conduction region; a step of forming a storage region having dispersed particulates, the number of which is larger than the number of crystal grains in the conduction region, on the tunnel insulating film; a step of forming a control insulating film on the storage region; a step of forming a control electrode on the control insulating film; and a step of forming a first impurity region adjacent to the conduction region and a second impurity region apart from the first impurity region and adjacent to the conduction region.

Further another method of manufacturing a memory device, according to the invention, comprises: a step of forming a control electrode on a substrate made of an insulating material; a step of forming a control insulating film on the control electrode; a step of forming a storage region comprised of a plurality of dispersed particulates on the control insulating film, with the surface density of the particulates being higher than that of structural holes (pin holes) in the tunnel insulating film; a step of forming a tunnel insulating film on the storage region; a step of forming a conduction region made of a semiconductor on the tunnel insulating film; and a step of forming a first impurity region adjacent to the conduction region and a second impurity region apart from the first impurity region and adjacent to the conduction region.

Further another method of manufacturing a memory device according to the invention comprises: a step of forming a control electrode on a substrate made of an insulating material; a step of forming a control insulating film on the control electrode; a step of forming a storage region comprised of five or more dispersed particulates on the control insulating film; a step of forming a tunnel insulating film on the storage region; a step of forming a conduction region made of a semiconductor on the tunnel insulating film; and a step of forming a first impurity region adjacent to the conduction region and a second impurity region apart from the first impurity region and adjacent to the conduction region.

Further another method of manufacturing a memory device according to the invention comprises: a step of forming a control electrode on a substrate made of an insulating material; a step of forming a control insulating film on the control electrode; a step of forming a storage region comprised of a plurality of dispersed particulates on the control insulating film; a step of forming a tunnel insulating film on the storage region; a step of forming a conduction region made of a semiconductor on the tunnel insulating film; and a step of forming a first impurity region adjacent to the conduction region and a second impurity region apart from the first impurity region and adjacent to the conduction region, wherein the conduction region is formed by a polysilicon film having the surface roughness of 0.1 nm to 100 nm and the number of particulates in the storage region is set to be larger than the number of crystal grains in the conduction region.

A method of manufacturing a semiconductor device according to the invention comprises: a step of forming a semiconductor film on a substrate and, after that, forming a film for forming a storage region of a nonstoichiometric composition, excessively containing a semiconductor element, on the semiconductor film; and a step of forming a storage region by dispersing the particulates of a semiconductor in the film for forming a storage region by performing heat treatment. The "nonstoichiometric composition" denotes a composition having a ratio of components out of the stoichiometric composition. In the invention, it denotes a case where a ratio of components is out of the range of the stoichiometric composition so as to contain an excessive semiconductor. The size of each of the particulates constructing the storage region lies within the range from 1 nm to 10 nm. As an example, silicon (Si), germanium (Ge), and the like can be used.

In the memory device and its manufacturing method according to the invention, either a construction such that the surface density of the particulates in the storage region is higher than that of structural holes (pin holes) produced in the tunnel insulating film, a construction that the number of particulates in the storage region is five or more, or a construction that the conduction region is formed by a polysilicon film whose surface roughness is 0.1 nm to 100 nm, is used, and the number of particulates in the storage region is larger than the number of crystal grains in the conduction region. Consequently, even when charges stored in a part of particulates are leaked due to a defect such as a pin hole occurred in the tunnel insulating film, charges stored in the particulates formed in the region where no defect occurs are not leaked. Thus, information is stored for a long time.

In the method of manufacturing the semiconductor device according to the invention, by performing heat treatment such as irradiation of an energy beam to the film for forming a storage region of a nonstoichiometric composition containing a semiconductor excessively, the particulates in the semiconductor are dispersed in the film for forming a storage region, and a storage region is thus formed.

BRIEF DESCRIPTION OF DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 is a cross section showing the structure of a memory device according to a first embodiment of the invention.

FIG. 2 is a cross section showing the structure of a memory device according to a second embodiment of the invention.

FIG. 6 is a circuit diagram for explaining a second method of integrating memory device of the invention.

FIGS. 12A and 12B are cross section and plan view for explaining a process following FIGS. 11A and 11B.

FIGS. 13A and 13B are cross section and plan view for explaining a process following FIGS. 12A and 12B.

FIGS. 14A and 14B are cross section and plan view for explaining a process following FIGS. 13A and 13B.

FIGS. 16A and 16B are cross section and plan view for explaining a third method of manufacturing the memory device according to the first embodiment.

FIGS. 17A and 17B are cross section and plan view for explaining a process following FIGS. 16A and 16B.

FIGS. 18A and 18B are cross section and plan view for explaining a process following FIGS. 17A and 17B.

FIGS. 19A and 19B are cross section and plan view for explaining a process following FIGS. 18A and 18B.

FIGS. 20A and 20B are cross section and plan view for explaining a process following FIGS. 19A and 19B.

FIGS. 21A and 21B are cross section and plan view for explaining a process of manufacturing the memory device according to a second embodiment of the invention.

FIGS. 22A and 22B are cross section and plan view for explaining a process following FIGS. 21A and 21B.

FIGS. 23A and 23B are cross section and plan view for explaining a process following FIGS. 22A and 22B.

FIGS. 24A and 24B are cross section and plan view for explaining a process following FIGS. 23A and 23B.

FIGS. 25A and 25B are cross section and plan view for explaining a process following FIGS. 24A and 24B.

DESCRIPTION OF THE PREFERRED EMBODIMENTS

Figure 3:
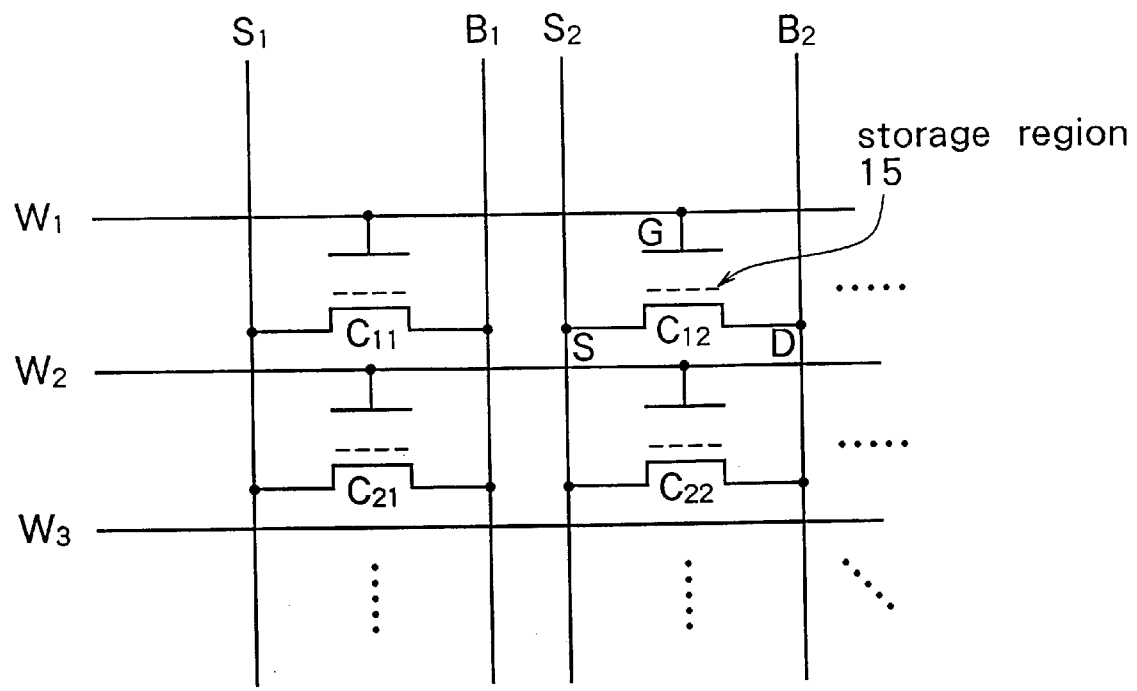
FIG. 3 is a circuit diagram for explaining an example of a first method of integrating memory device of the invention.

Embodiments of the invention will be described in detail hereinbelow with reference to the drawings.

FIG. 1 shows a basic structure of a memory device according to a first embodiment of the invention. In the following, a case where electrons are used as charges will be described as an example. When holes are used as charges, the following description is the same as the case except that the sign of a potential is to be reversed.

The memory device according to the embodiment has a structure comprising a conduction region 13c and a first impurity region 13a and a second impurity region 13b adjacently formed on both sides of the conduction region 13c configured on a buffer layer 12 formed on a substrate 11 made of a non-silicon material such as quartz, glass, or plastic and so on. The buffer layer 12 is comprised of an insulating film made of $SiO_2$ or $Si_3N_4$, and so on.

Each of the first impurity region 13a, the second impurity region 13b, and the conduction region 13c is comprised of, for example, a polysilicon layer 13 having a thickness of about tens of nm. Each of the first and second impurity regions 13a and 13b is formed by adding a Group V element such as phosphorus (P) as an n-type impurity, or a Group III element such as boron (B) as a p-type impurity to the polysilicon layer 13. Each of the first impurity region 13a and the second impurity region 13b and the conduction region 13c can be made of any semiconductor (non-single crystal semiconductor) except single crystal semiconductor. It can be made of, for example, amorphous $Si_xGe_{1-x}$ ($0 \leq x \leq 1$) or polycrystal $Si_xGe_{1-x}$ ($0 \leq x \leq 1$).

An insulating film 14 is provided in a corresponding position right on the conduction region 13c. The insulating film 14 consists of a tunnel insulating film 14a and a control insulating film 14b stacked on the tunnel insulating film 14a. Each of the tunnel insulating film 14a and the control insulating film 14b is made of $SiO_2$, $Si_3N_4$, $SiN_kO_l$ (k, l≠0), or the like. Between the tunnel insulating film 14a and the control insulating film 14b, a storage region 15 is provided to hold charges (electrons in this case). The thickness of the tunnel insulating film 14a is provided in a size (for example, less than 5 nm) that electrons can pass through the tunnel insulating film 14a into the storage region 15 by a quantum-mechanical tunnel effect.

The storage region 15 is comprised of more than one particulates (quantum dots) 15a discretely disposed. The particulates 15a is formed of semiconductor particulates made of $Si_yGe_{1-y}$ ($0 \leq y \leq 1$), $SiFe_2$, Group II–VI compound, Group III–V compound, or the like, metal particulates made of Au, Sb, Sn, or the like, or insulator particulates made of $SiN_z$ (z≠0) or the like.

In the storage region 15 of the embodiment, the number of particulates 15a (surface density) is larger than that (surface density) of structural holes (pin holes) opened in the tunnel insulating film 14a during the manufacturing process and is, specifically, five or more. Usually, the surface of the polysilicon layer 13 is rough. In the embodiment, it is preferable that the roughness is within the range from 0.1 nm to 100 nm and that the number of particulates 15a in the storage region 15 is larger than the number of crystal grains in the conduction region 13c.

On the insulating film 14, that is, in the position opposite to the conduction region 13c positioning the storage region 15 in the middle, a control electrode 16 is formed. The control electrode 16 is formed by a low-resistant polysilicon layer in which a metal such as aluminum (Al) or an impurity is doped. By the control electrode 16, an electric field is applied between the conduction region 13c and the storage region 15, controlling the conductivity of the conduction region 13c and the number of electrons in the storage region 15. The thickness of the control insulating film 14b between the control electrode 16 and the storage region 15 is provided in a size (for example 50 nm or thicker) that the electrons cannot pass through the control insulating film 14b by the quantum-mechanical tunnel effect.

The operation of the memory device having such a structure, that is, methods of writing and erasing information (data) and methods of holding and reading information will be described. In the description, it is assumed that the first impurity region 13a is connected to the ground (potential= 0V).

In the memory device, when the first and second impurity regions 13a and 13b are of the n-type, the potential applied to the second impurity region 13b is set to the same (0V) as that applied to the first impurity region 13a or a potential (for example, 10V) higher than the potential applied to the first impurity region 13a is applied, and a potential (for example, 20V) higher than that applied to the first impurity region 13a is applied to the control electrode 16. Consequently, charges (electrons) in the conduction region 13c pass through the tunnel insulating film 14a, placed between the conduction region and the storage region, by the quantum-mechanical tunnel effect and are stored in more than one particulates 15a dispersed in the storage region 15. In such a manner, information is written.

When the first and second impurity regions 13a and 13b are of the p-type, the potential to the second impurity region 13b is set to the same (0V) as that applied to the first impurity region 13a or a potential (for example, −10V) lower than that applied to the first impurity region 13a is applied, and a potential (for example, −20V) lower than that applied to the first impurity region 13a is applied to the control electrode 16. Consequently, charges (holes) in the conduction region 13c pass through the tunnel insulating film 14a, provided between the conduction region and the storage region, by the quantum-mechanical tunnel effect and are stored in more than one particulates 15a dispersed in the storage region 15. In such a manner, information is written. The information written as mentioned above is held by setting the potential to all of the electrodes to the same or keeping them in a floating state.

Since the storage region 15 is comprised of the five or more dispersed particulates 15a in the memory device of the embodiment as described above, even when charges stored in some of the particulates 15a are leaked due to a structural defect occurring in the tunnel insulating film 14a, the charges stored in the particulates 15a formed in the region without any defect in the tunnel insulating film 14a are not leaked. In the embodiment, therefore, the information stored in the storage region 15 can be held for a long time. This is similarly applied to a case where the roughness of the surface of the polysilicon layer 13 is within the range from 0.1 nm to 100 nm and the number of particulates 15a in the storage region 15 is larger than that of crystal grains in the conduction region 13c. That is, even when the electric field concentrates on the rough part of the polysilicon layer 13, since the particulates 15a also exist in the other region, the charges are not leaked and can be held for a long time. In the embodiment, therefore, the tunnel insulating film can be formed by a low-temperature process, enabling the usage of an inexpensive material such as glass or plastic as the substrate.

The written information is erased in such a manner that, when the first and second impurity regions 13a and 13b are of the n-type, while the potential applied to the second impurity region 13b is set to the same as that applied to the first impurity region 13a, a potential (for example, −20V) lower than that applied to the first impurity region 13a is applied to the control electrode 16, thereby making the charges (electrons) held in the storage region 15 move into the conduction region 13c passing through the tunnel insulating film 14a provided between the conduction region and the storage region.

When the first and second impurity regions 13a and 13b are of p-type semiconductors, the potential applied to the second impurity region 13b is set to the same as that applied to the first impurity region 13a and a potential (for example, 20V) higher than that applied to the first impurity region 13a is applied to the control electrode 16. By the operation, the charges (holes) held in the particulates 15a in the storage region 15 the conduction region 13c, passing through the tunnel insulating film 14a provided between the conduction region and the storage region move into, thereby making the information erased.

Further, the written information is read out by measuring the conductivity of the conduction region 13c with respect to the potential of the control electrode 16 or the current value detecting a change in charge amount in the storage region 15.

FIG. 2 shows the structure of a memory device according to a second embodiment of the invention. In a memory device 20, a control electrode 26 is provided on a substrate 21 made of, for example, quartz having a buffer layer 22 in between which is comprised of an insulating film made of $SiO_2$, $Si_3N_4$, or the like.

An insulating film 24 is formed on the buffer layer 22 and the control electrode 26. The insulating film 24 is comprised of an control insulating film 24b and a tunnel insulating film 24a stacked on the control insulating film 24b. Between the tunnel insulating film 24a and the control insulating film 24b, a storage region 25, comprised of more than one particulates 25a discretely disposed, is provided. On the insulating film 24, a conduction region 23c is provided, with a first impurity region 23a and a second impurity region 23b. The first impurity region 23a and the second impurity region 23b are adjacent to the conduction region 23c. The first and second impurity regions 23a and 23b and the conduction region 23c are formed a polysilicon layer 23.

Except for the fact that the memory device of the embodiment is the bottom-gate type, while the memory device of the first embodiment is what is called the top-gate type, other structures, actions (the methods of writing and erasing information, and methods of holding and reading information), and effects are substantially the same as those of the first embodiment. Their description is consequently omitted here.

Figure 4:
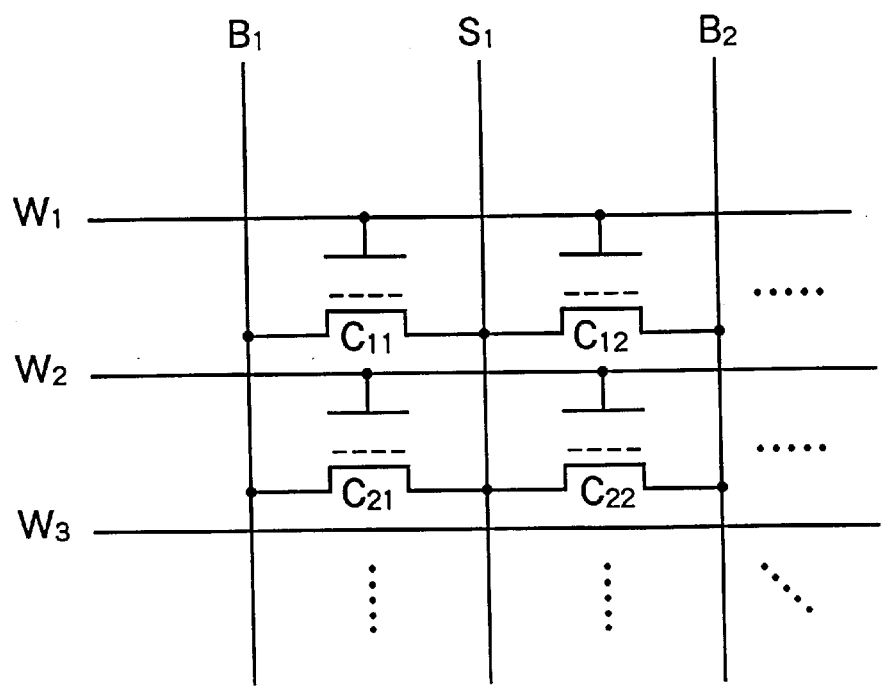
FIG. 4 is a circuit diagram for explaining another example of the first method of integrating memory device of the invention.
Figure 5:
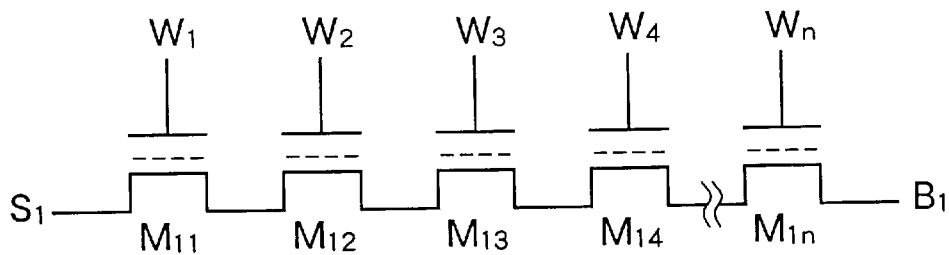

FIGS. 3 and 4 are circuit construction diagrams for explaining the first method of integrating the memory device. According to the first method, while a gate electrode in each memory device is connected to a word line, a source-drain path is connected between a bit line and a source line, and a plurality of memory device are arranged in parallel. FIG. 5 shows a circuit construction when the memory device are integrated by the second method. According to the second method, while the gate electrode of each memory device is connected to a word line, the source-drain path is connected between a bit line and a source line, and a plurality of memory device are arranged in series. The operations of the memory units integrated by the methods will be described hereinafter.

Making reference to FIGS. 6A, 6B to FIGS. 10A and 10B, the first method of manufacturing the memory device of the first embodiment will be described. Each of the diagrams B is a plan view and each of the diagrams A is a cross section taken along the line α—α of the diagram B.

Figure 6A:
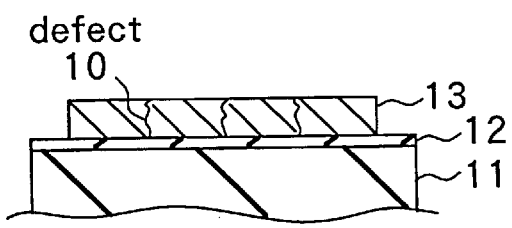
FIGS. 6A and 6B are cross section and plan view for explaining a first method of manufacturing the memory device according to the first embodiment.
Figure 6B:
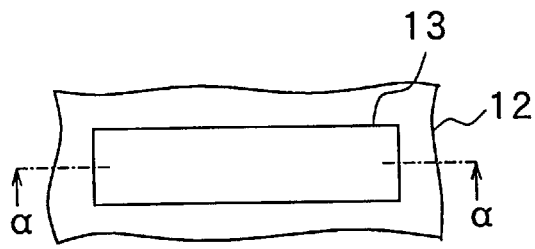

As shown in FIGS. 6A and 6B, the buffer layer 12 which is comprised of an $Si_3N_4$ layer or an $SiO_2$ layer having a thickness of, for example, about 100 nm is formed by, for example, CVD (Chemical Vapor Deposition) or sputtering on an insulating substrate such as the substrate 11 made of quartz, glass, plastic, or the like. After that, the substrate temperature is set to 600 to 700 ° C. and the polysilicon layer 13 having a thickness of about 10 nm is formed by, for example, CVD or sputtering. Then, device isolation is performed by etching. At this time, defects of holes (pin holes) 10 occur in the polysilicon layer 13.

Figure 7A:
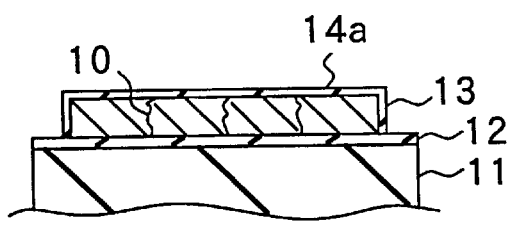
FIGS. 7A and 7B are cross section and plan view for explaining a process following FIGS. 6A and 6B.
Figure 7B:
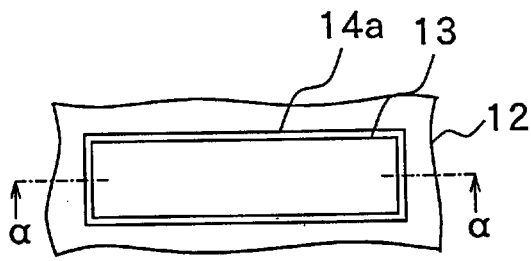

Subsequently, as illustrated in FIGS. 7A and 7B, by a thermal oxidation or an oxidizing method of exposing the surface of the substrate to an oxygen ionized gas, generated by introducing oxygen into an alternating current electromagnetic field, the surface of the. polysilicon layer 13 (conduction region Ch1) is oxidized only by the thickness of about 10 nm, thereby making the tunnel insulating film 14a formed. Although not shown, a plurality of holes (pin holes) occur as mentioned above in the tunnel insulating film 14a due to the holes 10 in the polysilicon layer 13.

Figure 8A:
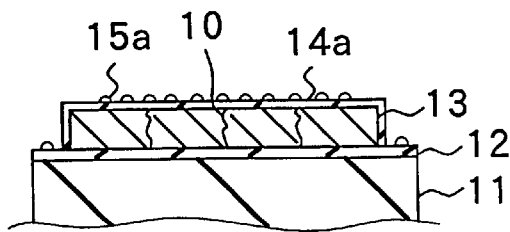
FIGS. 8A and 8B are cross section and plan view for explaining a process following FIGS. 7A and 7B.
Figure 8B:
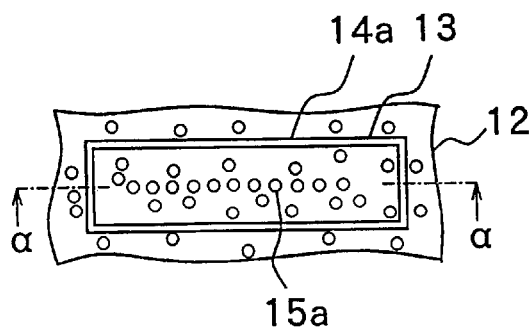

As shown in FIGS. 8A and 8B, by CVD using, a gas containing silicon atoms such as silane or disilane and a gas containing germanium atoms such as germane as materials, or sputtering using silicon, or germanium, or metal as a material, $Si_xGe_{1-x}$ ($0 \leq x \leq 1$) is deposited on the tunnel insulating film 14, thereby forming the storage region 15 comprised of more than one particulates 15a. The number of the particulates 15a at this time is set so that the coverage factor of the surface of the tunnel insulating film 14a is smaller than 1. The number of particulates is set to 5 or larger so that the surface density is higher than that of the defects occurred in the tunnel insulating film 14a.

Figure 9A:
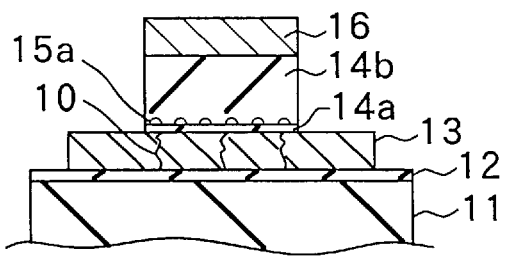
FIGS. 9A and 9B are cross section and plan view for explaining a process following FIGS. 8A and 8B.
Figure 9B:
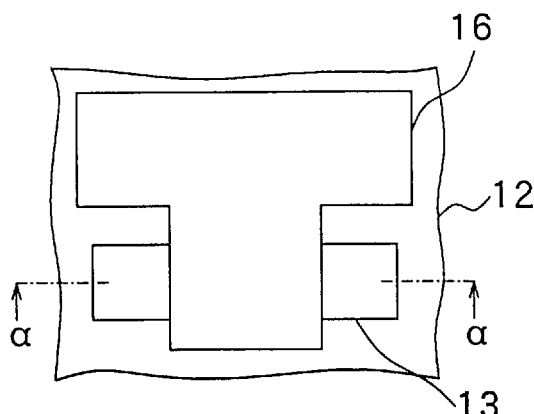

As shown in FIGS. 9A and 9B, by CVD using a gas containing silicon atoms such as $SiH_4$ (silane) or $Si_2H_6$ (disilane) and a gas containing oxygen atoms such as $N_2O$ (dinitrogen monoxide) or $O_2$ (oxygen), or by the sputtering of silicon in an ionized gas atmosphere of a gas containing oxygen atoms such as $N_2O$ or $O_2$, the control insulating film 14b having a thickness of about 100 nm is formed. Subsequently, the control electrode (gate electrode) 16 is formed by using polysilicon or a metal such as Al (aluminum), or Cu (copper), or W (tungsten) in a position opposite to the conduction region 13c (polysilicon layer 13) provided on the control insulating film 14b. After that, by using the control electrode 16 as a mask, the control insulating film 14b is selectively etched until the surface of the conduction region (polysilicon layer 13) by RIE (Reactive Ion Etching) using a mixture gas of $CF_4$ (carbon tetrafluoride) and $H_2$ (hydrogen).

Figure 10A:
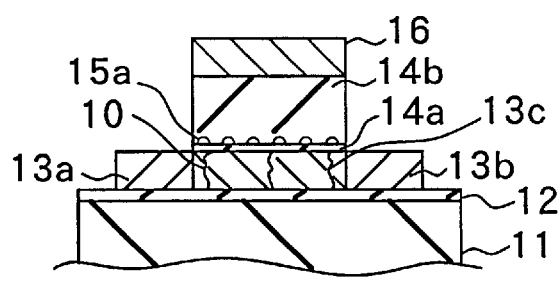
FIGS. 10A and 10B are cross section and plan view for explaining a process following FIGS. 9A and 9B.
Figure 10B:
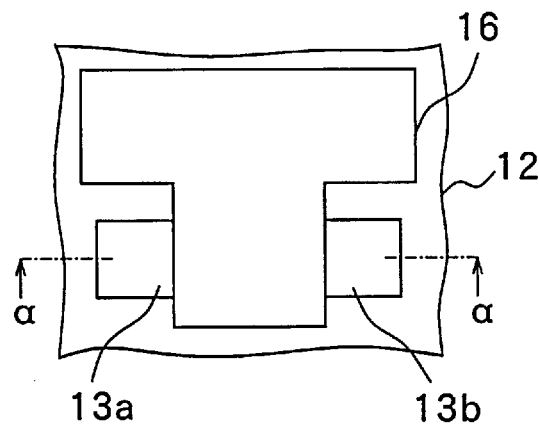

As illustrated in FIGS. 10A and 10B, ion implantation is performed by using the control electrode 16 as a mask, thereby forming the first impurity region 13a and the second impurity region 13b in the polysilicon layer 13. The ion implantation is carried out by ion implanting Group V atoms such as phosphorus (P) atoms when electrons are used as conduction charges, or by ion implanting Group III atoms such as boron (B) atoms when holes are used as conduction charges. The first impurity region 13a and the second impurity region 13b may also be formed by the polysilicon layer 13 being irradiated with an ionized gas containing the Group V atoms such as an ionized gas of $PH_3$ when electrons are used as conduction charges, or with an ionized gas containing the group III atoms such as an ionized gas of $B_2H_6$ when holes are used as conduction charges, with the control electrode 16 being used as a mask. After that, the element is heated by using a furnace or an excimer laser, thereby activating the implanted impurities.

After that, although not shown, a protective film made of $Si_3N_4$ or $SiO_2$ is formed by, for example, CVD or sputtering on the surface of the memory device formed as mentioned above.

Making reference to FIGS. 11A and 11B to FIGS. 14A and 14B, the second method of manufacturing the memory device of the first embodiment will be described. In the diagrams, each diagram B is a plan view, and each diagram A is a cross section taken along the line β—β of diagram B.

Figure 11A:
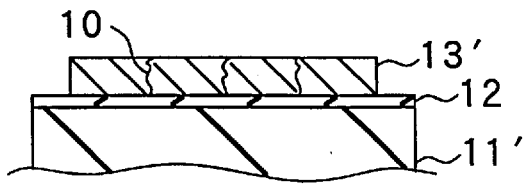
FIGS. 11A and 11B are cross section and plan view for explaining a second method of manufacturing the memory device according to the first embodiment of the invention.
Figure 11B:
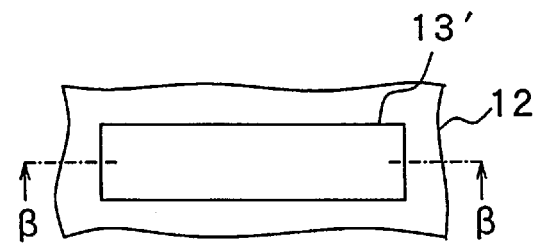
Figure 15:
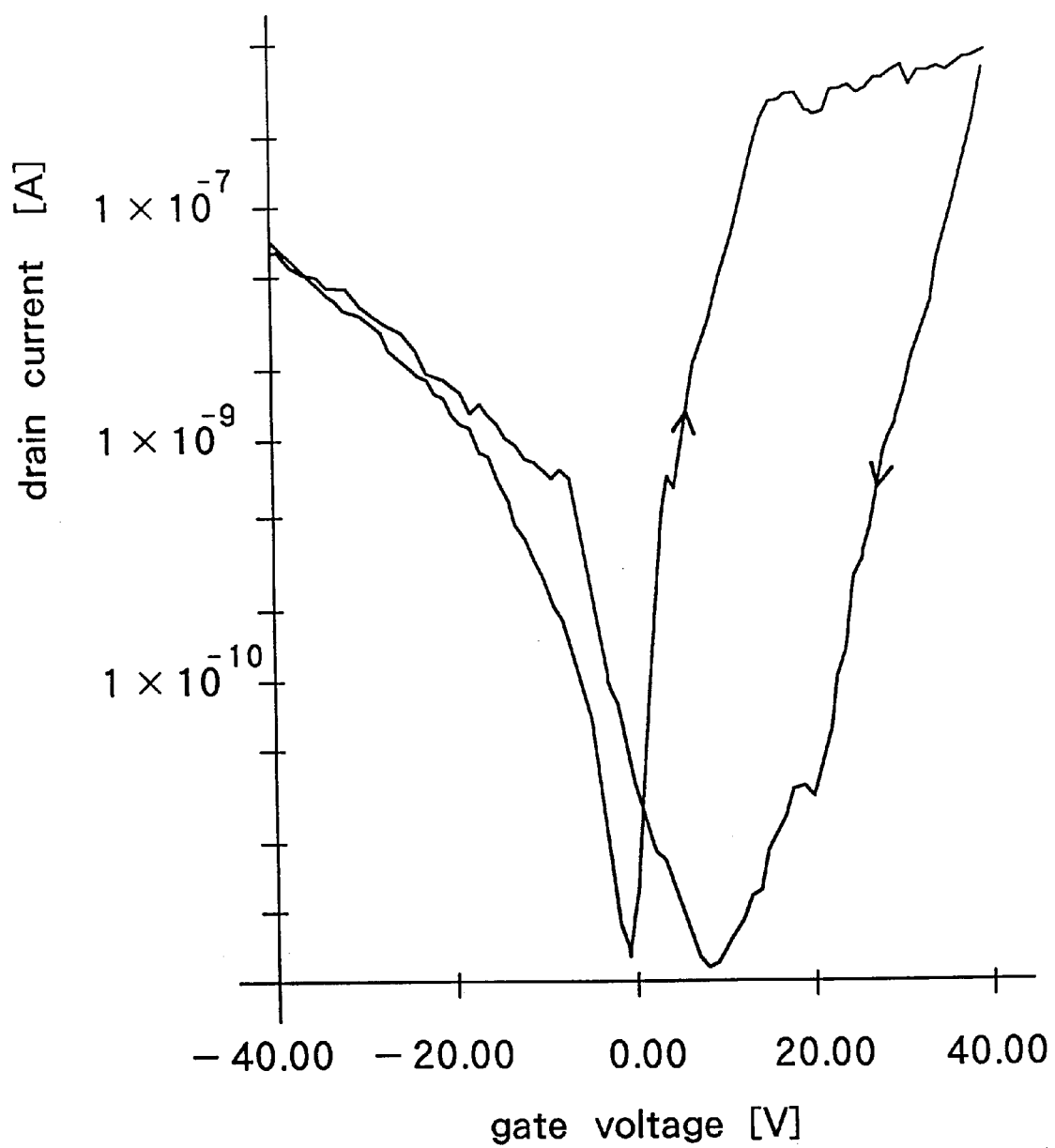
FIG. 15 is a characteristics diagram showing the relation between a gate voltage and a drain current of the memory device according to the first embodiment.

First, as shown in FIGS. 11A and 11B, the buffer layer 12 comprised of the $Si_3N_4$ layer or the $SiO_2$ layer having a thickness of about 100 nm is formed made of quartz or the like by CVD or sputtering on the substrate 11. Subsequently, by plasma CVD (Plasma Enhanced Chemical Vapor Deposition; PECVD) or sputtering, an amorphous silicon layer 13' having a thickness of about tens of nm is formed at a temperature at which no deformation occurs in the substrate 11, and then device isolation is performed by etching.

As shown in FIGS. 12A and 12B, the surface of the amorphous silicon layer 13' is oxidized by the plasma oxidizing method, the tunnel insulating film 14a which is comprised of an $SiO_x$ layer (x<2) having a thickness of tens of nm is formed on the surface of the amorphous silicon layer 13' by PECVD, and an XeCl excimer laser is irradiated by about 150 to 300 mJ/cm² to crystallize the amorphous silicon layer 13', thereby obtaining the polysilicon layer 13. At this time, excessive silicon in $SiO_x$ is deposited forming the storage region 15 comprised of many particulates 15a. Instead of forming the tunnel insulating film 14a comprised of the $SiO_x$ layer (x<2), in the same manner as the first method, the storage region 15 may be formed so that the coverage factor is smaller that 1 by CVD using, as materials, a gas containing silicon atoms such as silane or disilane and a gas containing germanium atoms such as germane or, by sputtering using silicon, or germanium, or a metal as a material.

As shown in FIGS. 13A and 13B, by CVD using, a gas containing silicon atoms such as silane or disilane, and a gas containing oxygen atoms such as $N_2O$ or $O_2$, or by the sputtering of silicon in an ionized gas atmosphere of a gas containing oxygen atoms such as $N_2O$ or $O_2$, the control insulating film 14b having a thickness of about 100 nm is formed. Subsequently, the control electrode 16 is formed by using polysilicon or a metal such as Al, Cu, or W, in a position opposite to the conduction region 13c in the polysilicon layer 13, provided on the control insulating film 14b. After that, by using the control electrode 16 as a mask, the control insulating film 14b is selectively etched until the surface of the conduction region (polysilicon layer 13) by RIE using a mixture gas of $CF_4$ and $H_2$.

As illustrated in FIGS. 14A and 14B, ion implantation is performed by using the control electrode 16 as a mask, thereby forming the first impurity region 13a and the second impurity region 13b in the polysilicon layer 13. In a manner similar to the first method, the ion implantation is carried out by ion implanting Group V atoms such as phosphorus (P) atoms when electrons are used as conduction charges, or by Group III atoms such as boron (B) atoms when holes are used as conduction charges. Alternatively, the polysilicon layer 13 is irradiated with an ionized gas containing the Group V atoms such as an ionized gas of $PH_3$ when electrons are used as conduction charges, or with an ionized gas containing the group III atoms such as an ionized gas of $B_2H_6$ when holes are used as conduction charges by using the control electrode 16 as a mask, thereby enabling the first and second impurity regions 13a and 13b to be formed. After that, the element is heated by using a furnace or an excimer laser, thereby activating the implanted impurities. After that, although not shown, a protective film made of $Si_3N_4$ or $SiO_2$ is formed by, for example, CVD or sputtering on the surface of the memory device formed as described above.

FIG. 16 shows gate voltage—drain current characteristics (memory effects) of the memory device fabricated in the embodiment. The drain voltage is 5V. The memory device is obtained in such a manner that an $SiO_{0.5}$ layer is formed by PECVD and an XeCl excimer laser having the energy density of 260 mJ/cm² is irradiated, thereby forming the storage region consisting of Si dots in the $SiO_{0.5}$ layer. Subsequently, ion implantation of phosphorus (P) is carried out by $PH_3$ plasma irradiation, thereby forming the first and second impurity regions and, further, annealing by the XeCl excimer laser (210 mJ/cm²) is performed to activate the implanted impurities.

Referring to FIGS. 16A and 16B to FIGS. 20A and 20B, a third method of manufacturing the memory device of the first embodiment will be described. In the diagrams, each diagram B is a plan view and each diagram A is a cross section taken along the line γ—γ of diagram B.

First, as shown in FIGS. 16A and 16B, the buffer layer 12 comprised of the $Si_3N_4$ layer or $SiO_2$ layer having a thickness of about 100 nm is formed by CVD or sputtering on the substrate 11 made of quartz or the like. Subsequently, by PECVD or sputtering, an amorphous silicon layer, with which an n-type or p-type impurity is doped and which has a thickness of about tens of nm, is formed at a temperature at which no deformation occurs in the substrate 11. By etching, the amorphous silicon layer is selectively removed and the first impurity region 13a and the second impurity region 13b are formed.

As shown in FIGS. 17A and 17B, the amorphous silicon layer 13' which does not contain the impurity is formed on the surface of the substrate 11 by PECVD or sputtering and, after that, the region except for the conduction region 13c and the region corresponding to the first and second impurity regions 13a and 13b is selectively etched.

As shown in FIGS. 18A and 18B, the amorphous silicon layer 13' is irradiated with the XeCl excimer laser within the range of 150 to 300 mJ/cm$^2$ so as to be crystallized, thereby obtaining the polysilicon layer 13.

As illustrated in FIGS. 19A ad 19B, the surface of the polysilicon layer 13 is oxidized by the plasma oxidizing method, and the tunnel insulating film 14a comprised of the SiO$_x$ layer (x<2) having a thickness of tens of nm is formed by PECVD on the surface of the polysilicon layer 13 and, after that, an XeCl excimer laser is irradiated by about 150 to 300 mJ/cm$^2$. Consequently, excessive silicon in SiO$_x$ is deposited forming the storage region 15 comprised of many particulates 15a. Instead of forming the SiO$_x$ layer (x<2), the storage region 15 having the coverage factor smaller than 1 may be formed by CVD using, as materials, a gas containing silicon atoms such as silane or disilane and a gas containing germanium atoms such as germane, or by sputtering using silicon, germanium, or a metal as a material as in the first method.

As shown in FIGS. 20A and 20B, by the chemical vapor deposition using a gas containing silicon atoms such as silane or disilane and a gas containing oxygen atoms such as N$_2$O or O$_2$, or by the sputtering of silicon in an ionized gas atmosphere of a gas containing oxygen atoms such as N$_2$O or O$_2$, the control insulating film 14b having a thickness of about 100 nm is formed. Subsequently, the control electrode 16 is formed by using polysilicon or a metal such as Al, Cu, or W in a position opposite to the conduction region 13c (polysilicon layer 13) provided on the control insulating film 14b. After that, by using the control electrode 16 as a mask, the control insulating film 14b is selectively etched until the surface of the conduction region (polysilicon layer 13) by RIE using a mixture gas of CF$_4$ and H$_2$.

After that, the element is heated by using a furnace or an excimer laser, thereby activating the implanted impurities. After that, although not shown, a protective film made of Si$_3$N$_4$ or SiO$_2$ is formed on the surface of the memory device formed as mentioned above by, for example, CVD or sputtering.

Making reference to FIGS. 21A and 21B to FIGS. 25A and 25B, a memory device manufacturing method of the second embodiment will be described. Each of the diagrams B is a plan view and each of the diagrams A is a cross section taken along the line ε—ε of the diagram B.

As shown in FIGS. 21A and 21B, the buffer layer 22 comprised of an Si$_3$N$_4$ layer, or an SiO$_2$ layer, or an SiN$_k$O$_1$ layer (k, 1≠0) having a thickness of, for example, about 100 nm is formed on the substrate 21 made of quartz, glass or plastic by, for example, CVD or sputtering. After that, a metal film made of W (tungsten), Ta (tantalum), Mo (molybdenum), or the like is deposited by, for example, electron beam deposition and is patterned, thereby forming the control electrode 26.

Subsequently, as illustrated in FIGS. 22A and 22B, by CVD or sputtering, the control insulating film 24b comprised of an SiO$_2$ layer having a thickness of about 100 nm, the tunnel insulating film 24a which is an SiO$_x$ (x<2) layer having a thickness of about tens of nm, and an amorphous silicon layer 23' having a thickness of about tens of nm to which no impurity is added, are formed in accordance with this order.

As shown in FIGS. 23A and 23B, by performing irradiation of about 150 to 300 mJ/cm$^2$ with an XeCl excimer laser, the amorphous silicon layer 23' is crystallized, thereby forming the polysilicon layer 23. At this time, excessive silicon in SiO$_x$ is deposited forming the storage region 25 comprised of many particulates 25a is formed in the tunnel insulating film 24a.

As shown in FIGS. 24A and 24B, device isolation is performed by selectively removing the polysilicon layer 23 and the tunnel insulating film 24a by, for example, RIE.

As illustrated in FIGS. 25A and 25B, a mask 27 made of photoresist or SiO$_2$ is formed on the polysilicon layer 23 in a region opposite to the control electrode 26. Subsequently, ion implantation is performed by using the mask 27, thereby forming the first impurity region 23a and the second impurity region 23b in the polysilicon layer 23. The ion implantation is carried out by ion implanting Group V atoms such as phosphorus (P) atoms, when electrons are used as conduction charges, or Group III atoms such as boron (B) atoms when holes are used as conduction charges. Alternatively, the first and second impurity regions 23a and 23b may be formed by the polysilicon layer 23 being irradiated with an ionized gas containing the Group V atoms such as an ionized gas of PH$_3$ when electrons are used as conduction charges, or with an ionized gas containing the group III atoms such as an ionized gas of B$_2$H$_6$ when holes are used as conduction charges, using the mask 27. After that, the element is heated by using a furnace or an excimer laser to activate the implanted impurities. After that, although not shown, a protective film made of Si$_3$N$_4$ or SiO$_2$ is formed by, for example, CVD or sputtering on the surface of the memory device formed as described above.

Figure 26:
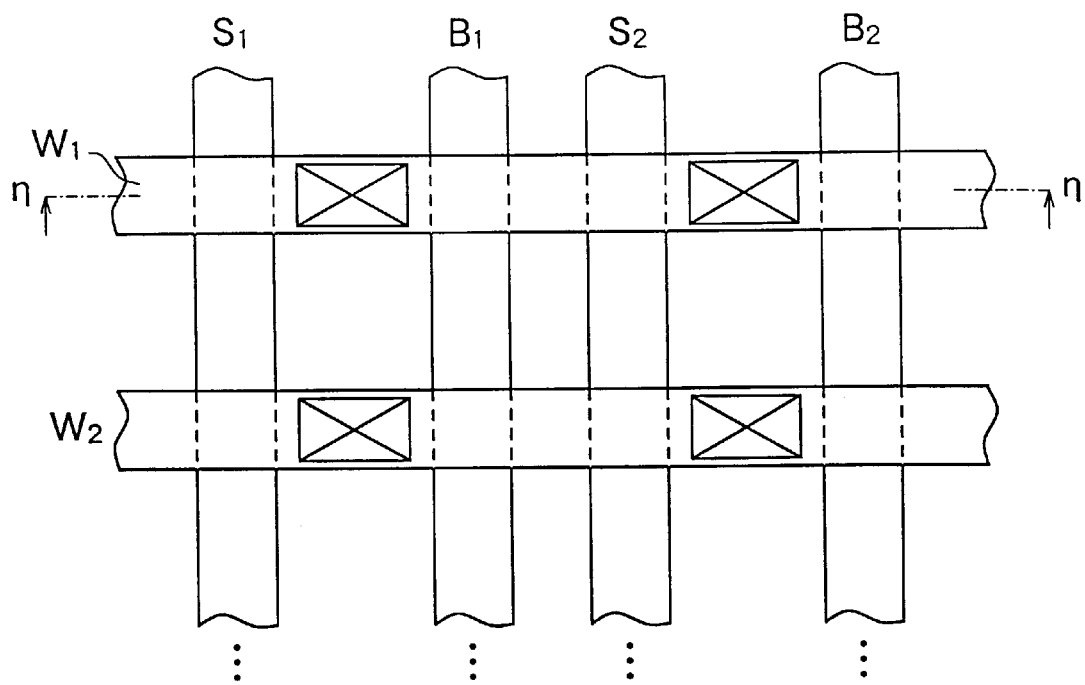
FIG. 26 is a plan view showing the structure of a memory unit according to a third embodiment of the invention.
Figure 27:
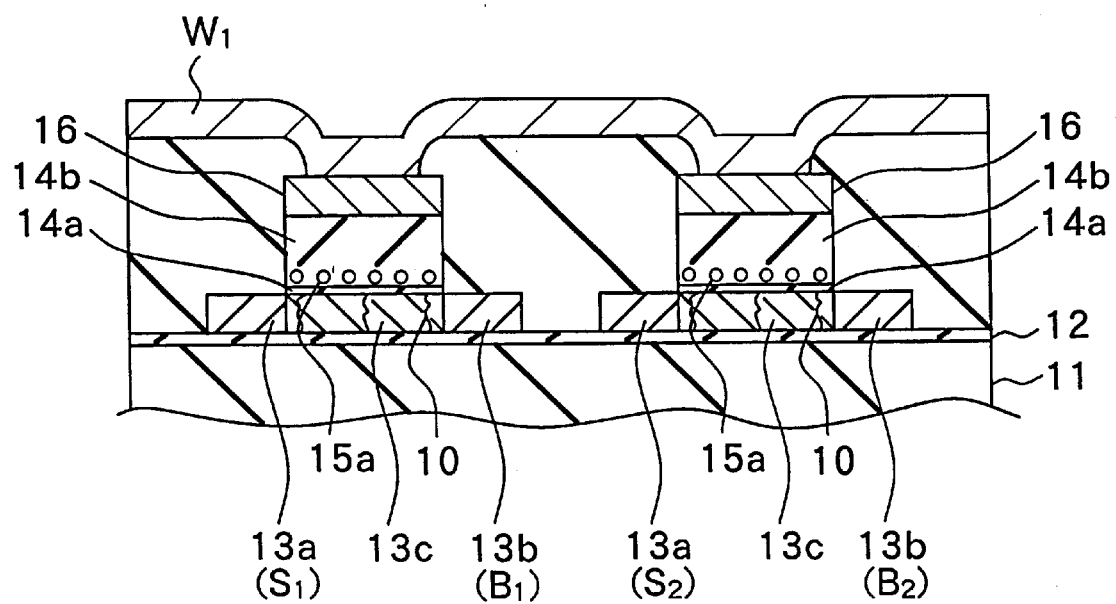
FIG. 27 is a cross section taken along the line $\eta$—$\eta$ of FIG. 26.

A third embodiment of the invention will now be described making reference to FIGS. 26 and 27. The embodiment shows an example of the structure of a memory unit obtained by integrating the top-gate type memory device shown in the first and the second embodiment. FIG. 26 is a plan view of an actual device to which the invention of the circuit diagram shown in FIG. 3 is applied. FIG. 27 is a cross section taken along the line η—η of FIG. 26.

In the memory unit, each of source lines S$_1$ and S$_2$, bit lines B$_1$ and B$_2$, and word lines W$_1$ and W$_2$ is formed by a polysilicon layer to which metal such as Al or Cu or impurity is implanted. Although only a memory array of 2×2 is shown here, obviously, a general memory array is of n×m (n, m>1). This is also similarly applied to the following embodiments.

A method of integrating the memory device will now be described.

According to the first method of integrating memory device, as shown in FIGS. 3 and 4, that the electrodes (G) for control of the memory device are connected to the word lines W1, W2, . . . and a plurality of memory device each having a source-drain path connected between the bit line and the source line are arranged in parallel. It is sufficient to apply the potentials of the source line, bit line, and word line to the first impurity region, gate region, and the second impurity region as mentioned above, in order to write, erase, hold, and read out information with respect to each of the memory device.

According to the second method of integrating the memory device, as shown in FIG. 5, the control electrode of the memory device is connected to the word line and a plurality of memory device, in which the source-drain paths are connected between the bit line and the source line, are arranged in series. It is sufficient to apply the potentials of the source line, bit line, and word line to the first impurity region, gate region, and second impurity region of each memory device as mentioned above in order to write, erase, hold, and read out information with respect to each of the memory device.

Figure 28:
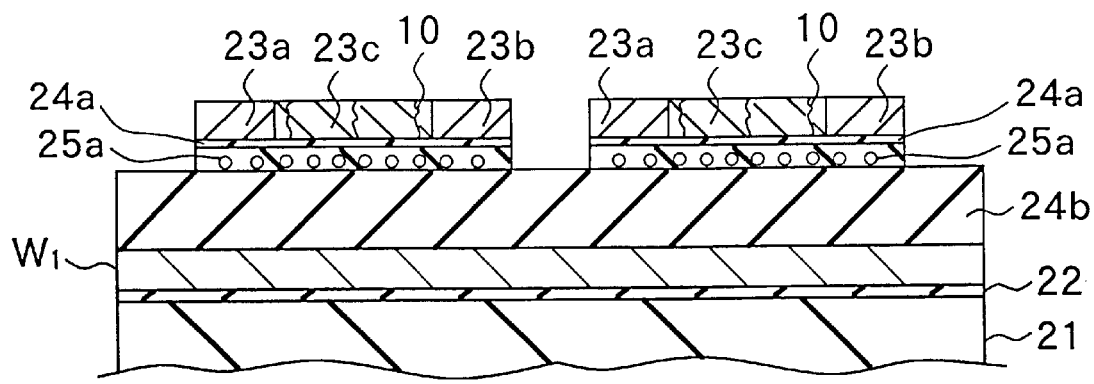
FIG. 28 is a cross section of a memory unit according to a fourth embodiment of the invention.

FIG. 28 shows an example of the structure of a memory unit obtained by integrating bottom-gate type memory device according to the fourth embodiment of the invention. The structure in plan view is similar to that in FIG. 26. FIG. 28 corresponds to the structure in cross section taken along the line η—η of FIG. 26. The method of manufacturing each element is as described above. When the elements are integrated as well, the integrated memory unit can be easily diverted. Consequently, its specific description is omitted here.

Figure 29:
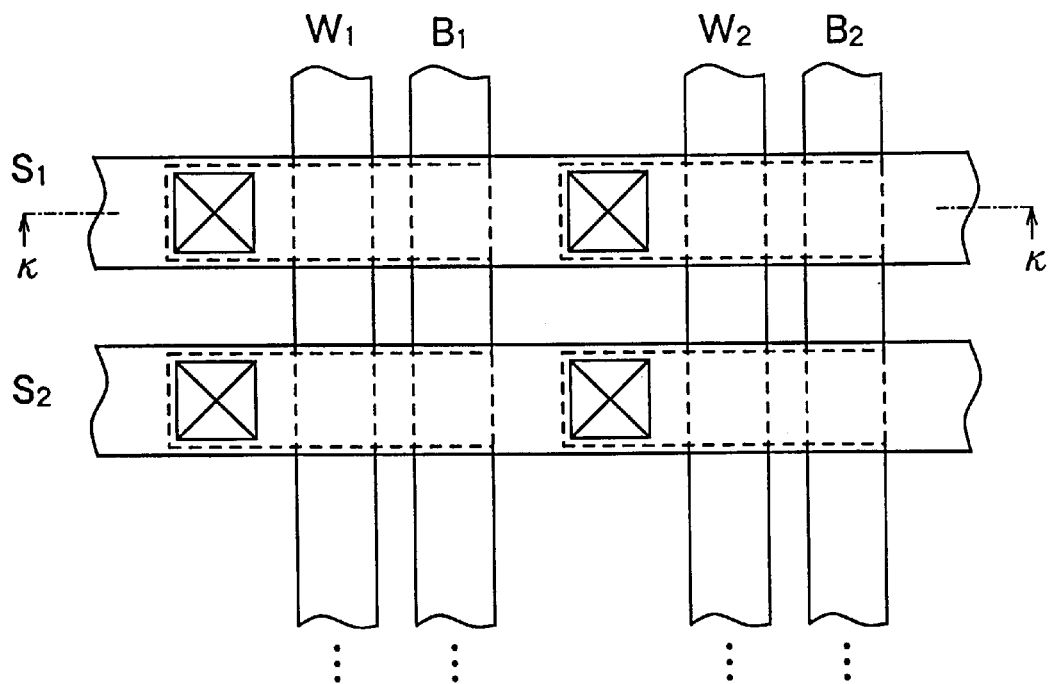
FIG. 29 is a plan view showing the structure of a memory unit according to a fifth embodiment of the invention.
Figure 30:
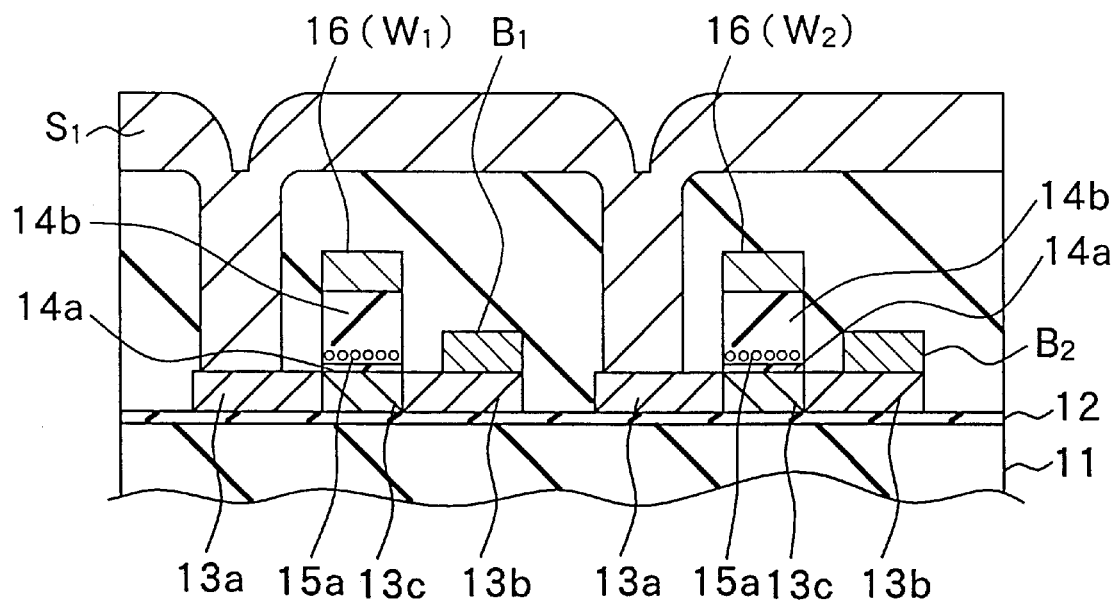
FIG. 30 is a cross section taken along the line $\kappa$—$\kappa$ of FIG. 29.

FIGS. 29 and 30 represent an example of the structure of a memory unit using top-gate type memory device according to a fifth embodiment of the invention. FIG. 29 is a plan view of an actual device to which the invention of the circuit diagram of FIG. 3 is applied. FIG. 30 is a cross section taken along the line κ—κ of FIG. 29. The source lines $S_1$ and $S_2$, bit lines $B_1$ and $B_2$, and word lines $W_1$ and $W_2$ are formed by a polysilicon layer to which a metal such as Al or Cu or impurity is implanted.

Figure 31:
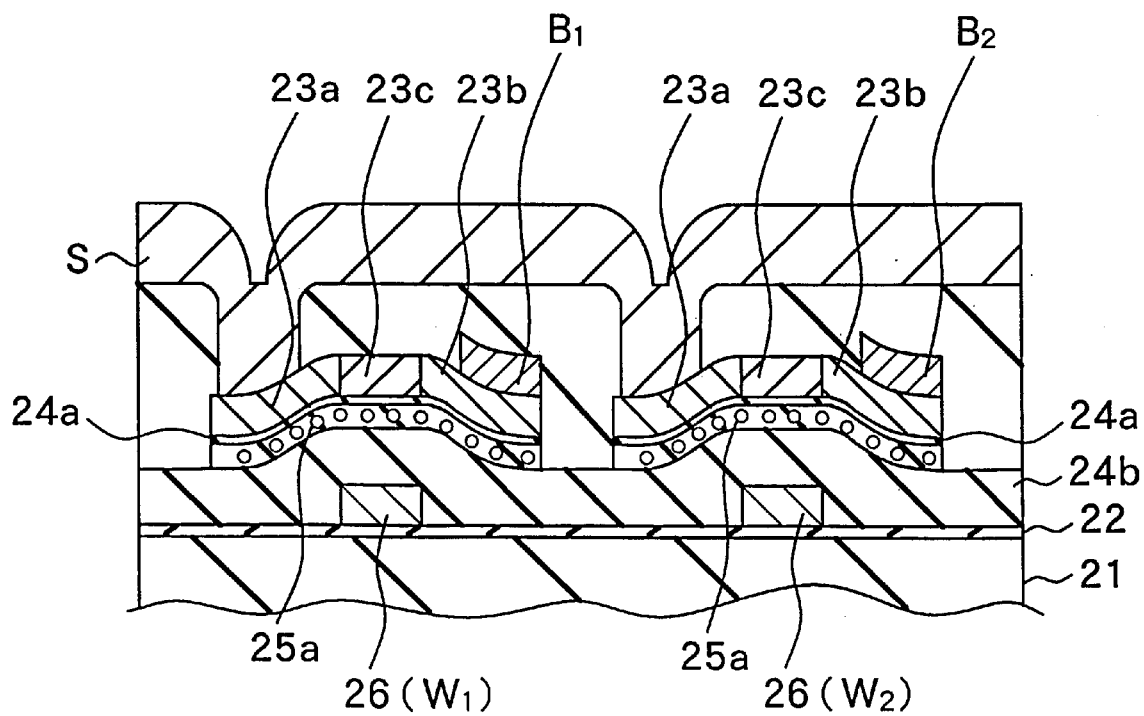
FIG. 31 is a cross section of a memory unit having bottom-gate structured elements.

FIG. 31 shows an example of integrating bottom-gate type memory device according to the second embodiment.

A case of writing and erasing information and holding and reading information to/from a specific element, for example a memory device $C_{nm}$ in FIG. 3, among the plurality of memory device of the memory unit according to the embodiment will be described specifically. In the following description, it is assumed that the concerned memory device has n-type conductivity. In case of using a memory device of p-type conductivity, it is sufficient to reverse the sign of the potential in the following description.

When writing information to the memory device $C_{nm}$, 0V is applied to the source line $S_m$, the word lines $W_1$ to $W_{n-1}$ except for the word line $W_n$, a potential $V_p$ (for example, 10V) is applied to the word line $W_n$, and a potential $V_p$ (for example, 5V) is applied to the bit line $B_m$. Preferably, in order to prevent information, in the other memory device-around the memory device $C_{nm}$, from being erroneously erased, a potential of only $V_p/2$ should be applied to the source line $S_i$ and the bit line $B_i$ (i # m).

When erasing the information written in the memory device $C_{nm}$, 0V is applied to the source line $S_m$ and the word lines except for the word line $W_n$, a potential of $-V_p$ (for example, -10V) is applied to the word line $W_n$, and a potential $-V_d$ (for example, -5V) is applied to the bit line $B_m$. At this time, in order to prevent information, in the other memory device around the memory device $C_{nm}$, from being erroneously written, a potential of only $-V_p/2$ should be applied to the source line $S_m$ and the bit lines except for the bit line $B_m$.

When holding the information written in the memory device $C_{nm}$, the potential of all of electrodes is set to the same or in a floating state.

When reading the information from the memory device $C_{nm}$, 0V is applied to all of the source lines and the bit lines except for the bit line $B_m$, 0V is applied to the word lines except for the word line $W_n$, a potential $V_r$ (for example, 5V) is applied to the word line $W_n$, a potential $V_d$ (for example, 5V) is applied to the bit line $B_m$, and a current passing the bit line $B_m$ is measured. The writing state of the memory device $C_{nm}$ is consequently computed and the reading of information is performed.

Figure 32:
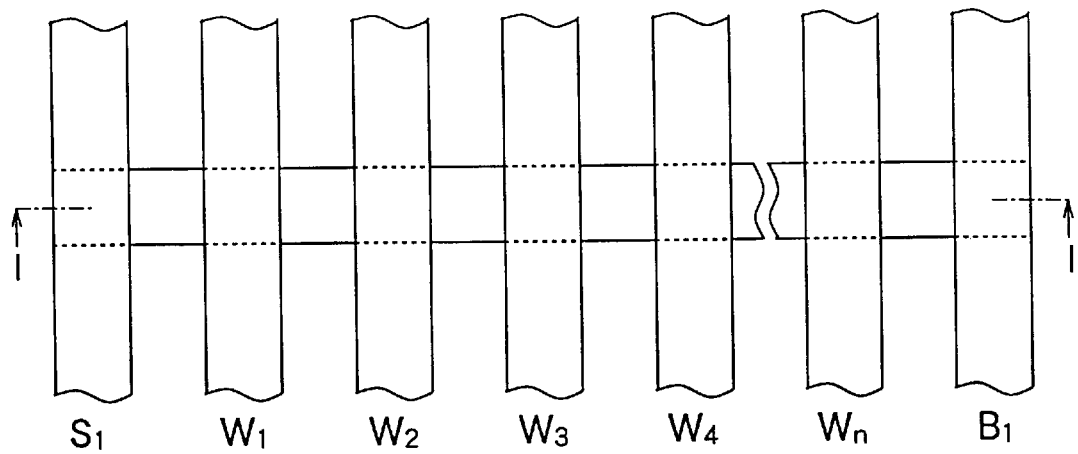
FIG. 32 is a plan view showing the structure of a memory unit according to a sixth embodiment of the invention.
Figure 33:
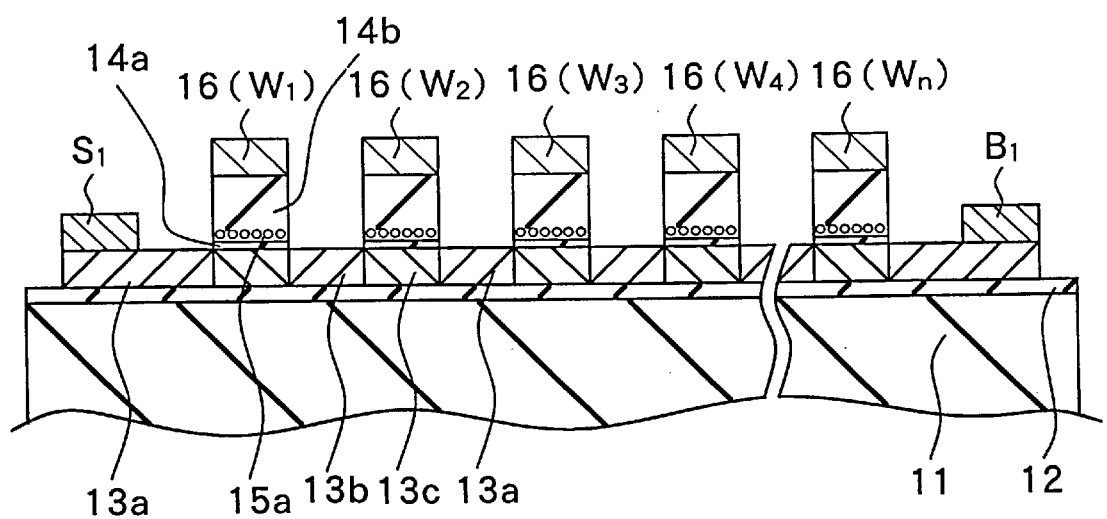
FIG. 33 is a cross section taken along the line 1—1 of FIG. 32.

FIGS. 32 and 32 show an example of the structure of a memory unit using top-gate type memory device according to the sixth embodiment of the invention. FIG. 32 is a plan view of an actual device to which the invention of the circuit diagram shown in FIG. 5 is applied. FIG. 33 is a cross section taken along the line 1—1 of FIG. 32. In the embodiment, the source line $S_1$, bit line $B_1$, and word lines $W_1$, $W_2$, $W_3$, $W_4$, . . . , $W_n$ are formed by the polysilicon layer, to which a metal such as Al, Cu or impurity is implanted, as well.

Figure 34:
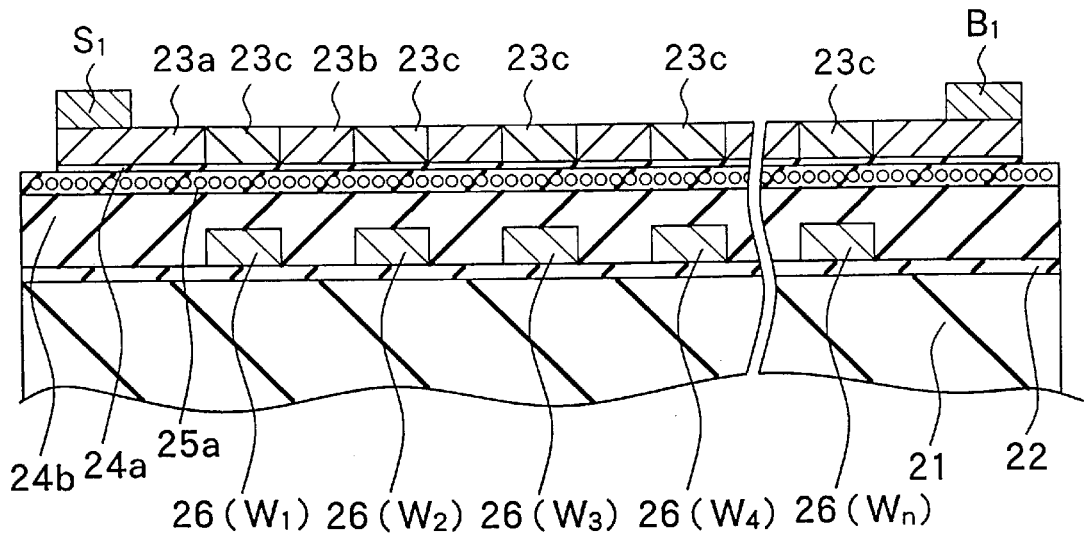
FIG. 34 is a cross section of a memory unit having bottom-gate structured elements.

FIG. 34 shows an example in which bottom-gate type memory device according to the second embodiment are integrated. In a manner similar to FIG. 33, FIG. 34 corresponds to the cross section taken along the line 1—1 of FIG. 32.

An operation in the case of writing and erasing information and holding and reading information with respect to a specific element, for example, a memory device $M_{nm}$ (refer to FIG. 5) in the memory unit according to the embodiment will be described. In the following description, it is assumed that the memory device has the n-type conductivity. Description of the case of a memory device having the p-type conductivity is omitted here.

When writing information to the memory device $M_{nm}$, 0V is applied to all of the source lines, a potential $V_p$ (for example, 10V) is applied to the word line $W_m$, $V_p/2$ (for example, 5V) is applied to the word lines except for the word line $W_m$, 0V is applied to the bit line $B_n$, and $V_p/2$ (for example, 5V) is applied to bit lines in a memory device line including memory device whose gates are connected to the word line $W_m$ except for the bit line $B_n$.

When erasing the information written in the memory device $M_{nm}$, 0V is applied to all of source lines, a potential $-V_p$ (for example, -10V) is applied to the word line $W_m$, $V_p/2$ (for example, 5V) is applied to word lines except for the word line $W_m$, 0V is applied to the bit line $B_n$, and $-V_p/2$ (for example, -5V) is applied to bit lines in a memory device line including memory device whose gates are connected to the word line $W_m$ except for the bit line $B_n$.

In order to hold the information written in the memory device $M_{nm}$, the potential to all of electrodes is set to the same or in a floating state.

When reading the information, 0V is applied to all of the source lines and the bit lines except for the bit line $B_n$, 0V is applied to the word lines except for the word line $W_m$, 0V is applied to the word line $W_n$, a potential $V_d$ (for example, 5V) is applied to the bit line $B_m$, and a current passing through the bit line $B_m$ is measured. Thereby, the information written in the memory device Mnm is read out.

Referring to FIGS. 35 to 39, a method of simultaneously fabricating memory device, according to the first embodiment (FIG. 1), and a peripheral circuit such as a control circuit on the same substrate will be described.

Figure 35:
FIG. 35 is a cross section for explaining a process of manufacturing a memory unit according to a seventh embodiment of the invention.

As shown in FIG. 35, an $Si_3N_4$ and $SiO_2$ layers having a thickness of about 100 nm is formed as the buffer layer 12 by CVD or sputtering on the substrate 11 made of quartz, glass or plastic. After that, the amorphous silicon layer 13' of tens of nm is formed by PECVD or sputtering on the surface of the buffer layer 12 at a temperature at which no deformation occurs in the substrate, and device isolation is performed by etching.

Figure 36:
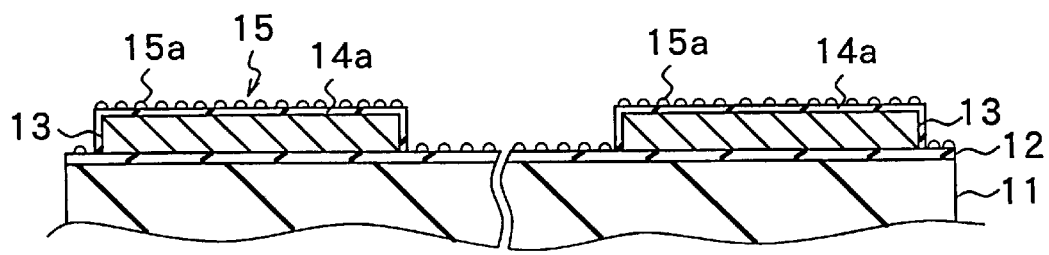
FIG. 36 is a cross section for explaining a process following FIG. 35.

Subsequently, as illustrated in FIG. 36, after forming the tunnel insulating film 14a by oxidizing the surface of the amorphous silicon layer 13' by the plasma oxidizing method, an $SiO_x$ (x<2) layer having a thickness of tens of nm is formed on the tunnel insulating film 14a by PECVD. After that, irradiation of about 150 to 300 mJ/cm² is performed by the XeCl excimer laser. Consequently, as shown in FIG. 36, while the amorphous silicon layer 13' is crystallized and becomes the polysilicon layer 13, excessive silicon in $SiO_x$ is deposited forming the storage region 15 comprised of many particulates 15a.

Figure 37:
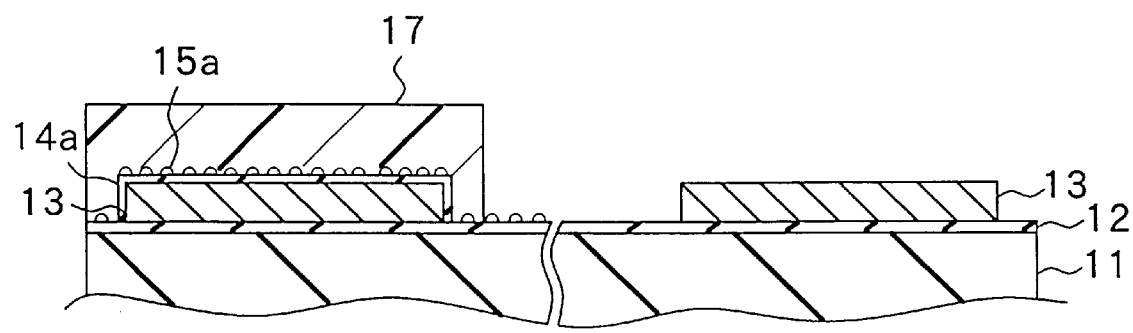
FIG. 37 is a cross section for explaining a process following FIG. 36.

As illustrated in FIG. 37, the memory device side (left half of the diagram) is covered with a photoresist film 17, and the storage region formed on the peripheral circuit side (right half of the diagram) is selectively removed by RIE using a mixture gas of $SF_6$ or $CF_4$, and $H_2$. After that, the photoresist film 17 is removed.

Figure 38:
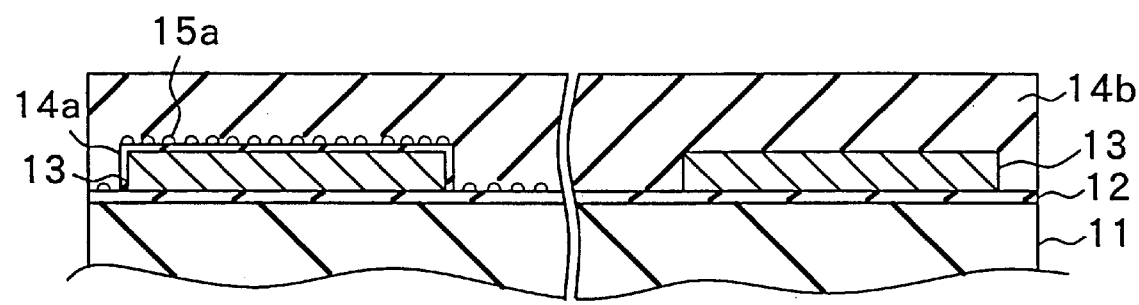
FIG. 38 is a cross section for explaining a process following FIG. 37.

As shown in FIG. 38, by CVD using a gas containing silicon atoms such as silane or disilane, and a gas containing oxygen atoms such as $N_2O$ or $O_2$, or sputtering of silicon in an ionized gas atmosphere of a gas, containing oxygen atoms such as $N_2O$ or $O_2$, the control insulating film 14b having a thickness of about 100 nm is formed. Subsequently, the control electrodes 16 ($G_m$, G) are formed on the control insulating film 14b using a polysilicon layer or a metal such as Al, Cu, or W. After that, etching is performed by RIE using a mixture gas of $CF_4$ and $H_2$ until the surface of the polysilicon layer 13 using the control electrodes 16 ($G_m$, G) as masks.

Figure 39:
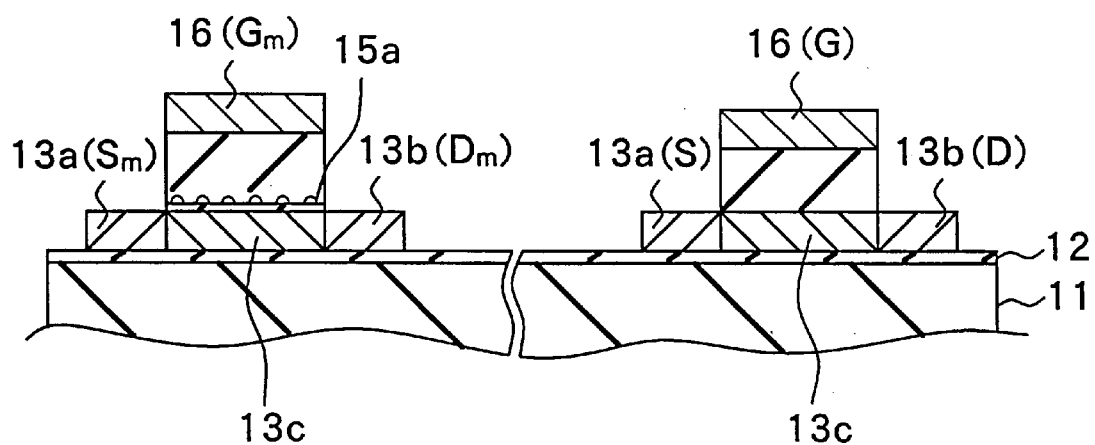
FIG. 39 is a cross section for explaining a process following FIG. 38.

As shown in FIG. 39, using the control electrodes 16 ($G_m$, G) as masks, ion implantation is performed with the Group V atoms such as phosphorus when electrons are used as conduction charges, or with the Group III atoms such as boron when holes are used as conduction charges, thereby forming the first impurity regions 13a ($S_m$, S) and the second impurity regions 13b ($D_m$, D). By irradiating an ionized gas containing the Group V atoms such as $PH_3$ when electrons are used as conduction charges, or an ionized gas containing the Group III atoms such as $B_2H_6$ when holes are used as conduction charges, the first impurity regions 13a ($S_m$, S) and the second impurity regions 13b ($D_m$, D) are formed. After that, the elements are heated by using a furnace or an excimer laser to activate the implanted impurities. After that, necessary wiring is carried out, and the surface of the substrate is covered with $Si_3N_4$ or $SiO_2$ by CVD or by sputtering, thereby forming a protective film.

Referring to FIGS. 40 to 45, a method of fabricating a peripheral circuit simultaneously with memory device according to the second embodiment (FIG. 2) on the same substrate will be described.

Figure 40:
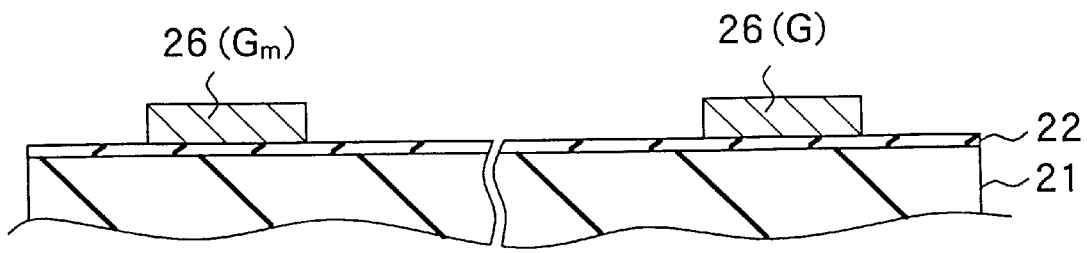
FIG. 40 is a cross section for explaining a process of manufacturing a memory unit according to an eighth embodiment of the invention.

As shown in FIG. 40, the buffer layer 22 made of $Si_3N_4$ or $SiO_2$ having a thickness of about 100 nm is formed on the substrate 21 made of quartz or the like by CVD or sputtering. After that, a film made of tungsten, tantalum, molybdenum, or the like is formed by electron beam deposition or sputtering and patterned, thereby forming the control electrodes 26 ($G_m$, G).

Figure 41:
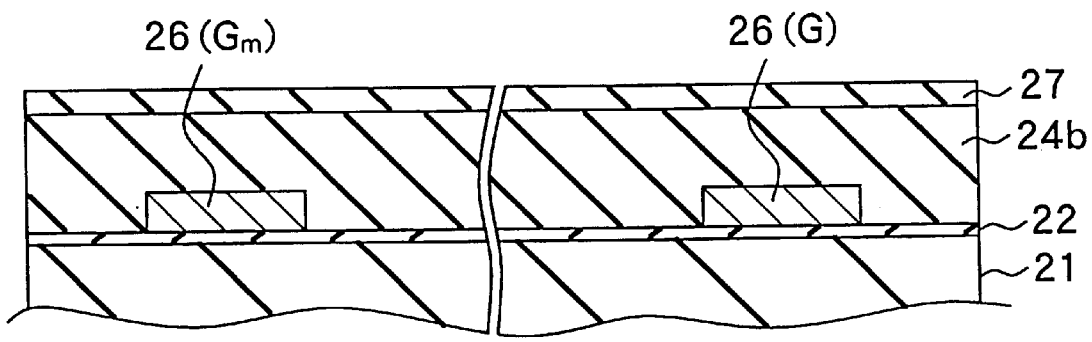
FIG. 41 is a cross section for explaining a process following FIG. 40.

Subsequently, as illustrated in FIG. 41, after forming the control insulating film 24b made of $SiO_2$ having a thickness of about 100 nm by using CVD or sputtering, an $SiO_x$ (x<2) layer 27 having a thickness of tens of nm is formed.

Figure 42:
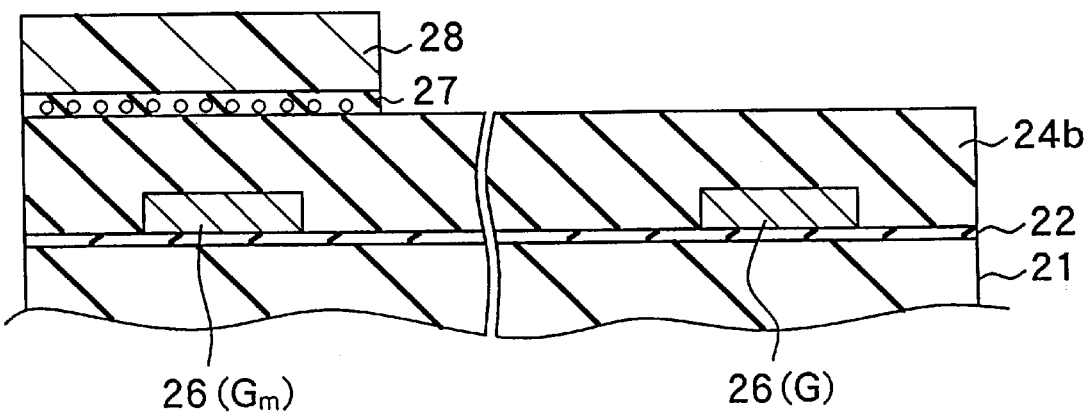
FIG. 42 is a cross section for explaining a process following FIG. 41.

As shown in FIG. 42, the memory device side (left side in the diagram) is covered with a photoresist film 28, and the $SiO_x$ layer 27 formed on the peripheral circuit side (right side in the diagram) is selectively etched by RIE, using a mixture gas of $SF_6$ or $CF_4$ and $H_2$. After that, the photoresist film 28 is removed.

Figure 43:
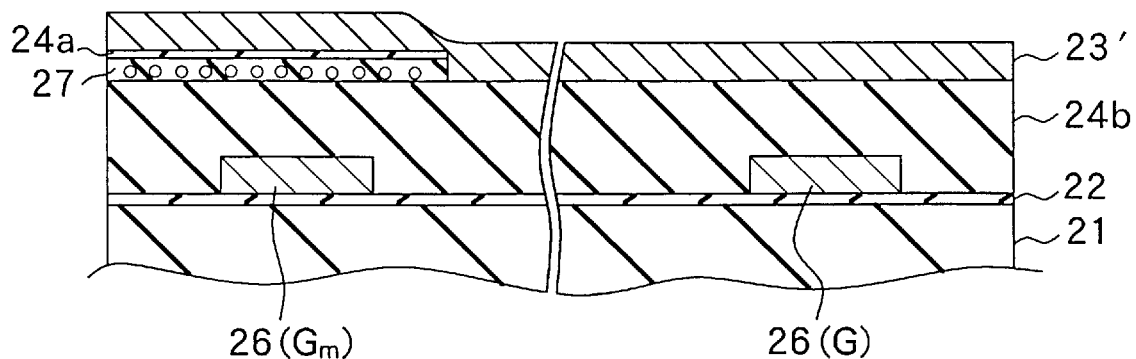
FIG. 43 is a cross section for explaining a process following FIG. 42.
Figure 44:
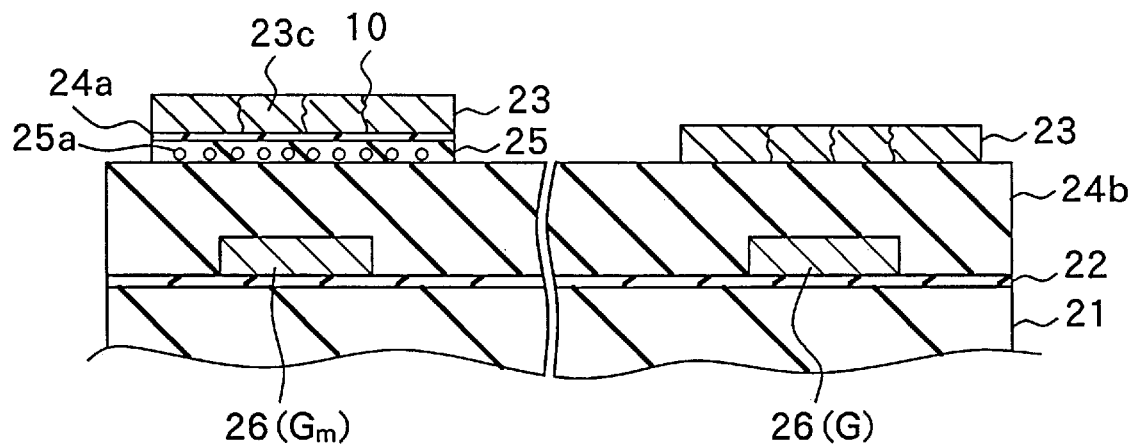
FIG. 44 is a cross section for explaining a process following FIG. 43.

As shown in FIG. 43, the tunnel insulating film 24a is formed on the surface of the $SiO_x$ layer 27 by performing the plasma oxidizing method. After that, by CVD, sputtering, or PECVD, the amorphous silicon layer 23' having a thickness of tens of nm is formed on the tunnel insulating film 24a and the control insulating film 24b. As shown in FIG. 44, the XeCl excimer laser of 150 to 300 mJ/cm$^2$ is irradiated in the range. By the irradiation, the amorphous silicon layer 23' is crystallized, being converted into the polysilicon layer 23 forming the storage region 25 comprised of many particulates 25a. Subsequently, the etching for device isolation is performed.

Figure 45:
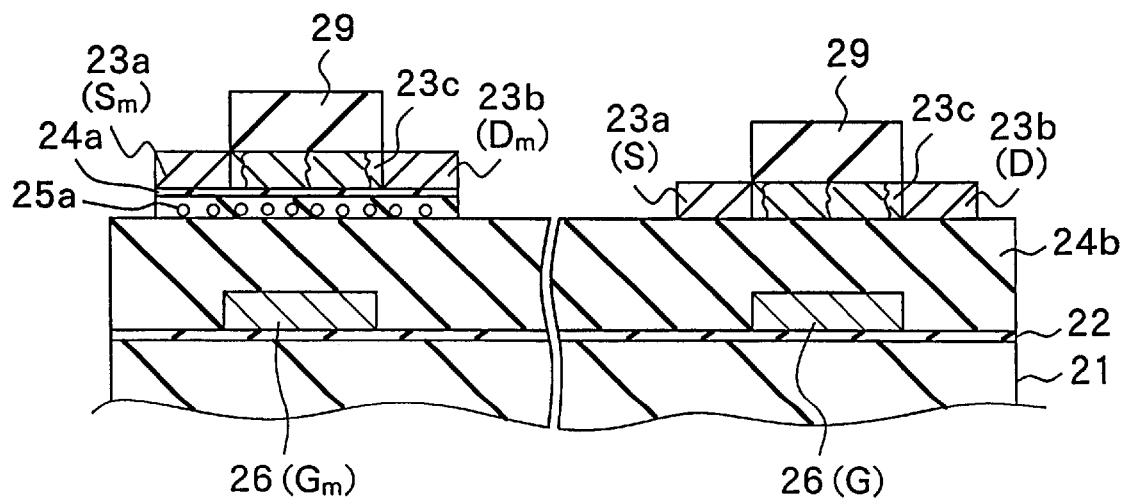
FIG. 45 is a cross section for explaining a process following FIG. 44.

Then, as shown in FIG. 45, a mask 29 is formed by a photoresist film or by a $SiO_2$ film in regions corresponding to the control electrodes 26 (Gm, G) on the polysilicon layer 23. By using the mask 29, ion implantation of the Group V atoms such as phosphorus is performed when electrons are used as conduction charges. Ion implantation of the Group III such as boron is performed when holes are used as conduction charges. Consequently, the first impurity regions 23a ($S_m$, S) and the second impurity regions 23b ($D_m$, D) are formed. Alternatively, in place of the ion implantation, the first impurity regions 23a ($S_m$, S) and the second impurity regions 23b ($D_m$, D) may be formed by irradiating an ionized gas containing the Group V atoms such as $PH_3$ when electrons are used as conduction charges, or by irradiating an ionized gas containing the ground III atoms such as $B_2H_6$ when holes are used as conduction charges. After that, the elements are heated by using a furnace or an excimer laser, thereby activating the implanted impurity. Then, necessary wiring is carried out and a protective film (not shown) made of $Si_3N_4$ or $SiO_2$ is deposited on the surface of the memory unit by CVD or sputtering.

Referring to FIGS. 46 to 51, a method of producing a memory unit having the structure in which the memory device of the first embodiment is stacked on a peripheral circuit fabricated on a semiconductor substrate will be described.

Figure 46:
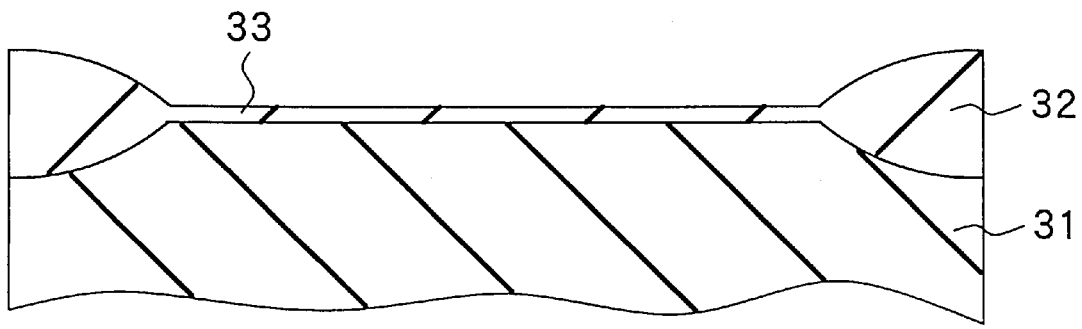
FIG. 46 is a cross section for explaining a process of manufacturing a memory unit according to a ninth embodiment of the invention.

As illustrated in FIG. 46, the surface of a washed silicon single crystal substrate 31 is selectively oxidized by LOCOS (Local Oxidation of Silicon), a field oxide film 32 for device isolation is formed, and a gate oxide film 33 is formed by thermal oxidation.

Figure 47:
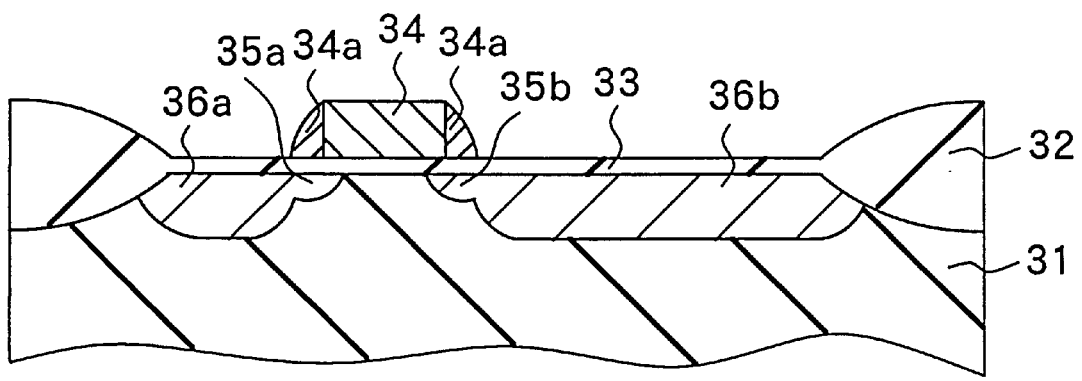
FIG. 47 is a cross section for explaining a process following FIG. 46.

As shown in FIG. 47, by using CVD or sputtering, an control electrode 34 comprised of a polysilicon layer or made of a metal such as Al, W, Cu is formed. Ion implantation is performed by using the control electrode 34 as a mask, thereby forming n-type LDD (Lightly Doped Drain) regions 35a and 35b. Subsequently, gate side walls 34a made of, for example, $SiO_2$ are formed on the side walls of the control electrode 34, and ion implantation is performed by using the gate side walls 34a and the control electrode 34 as a mask, thereby forming a source region 36a and a drain region 36b of the n$^{++}$ type.

Figure 48:
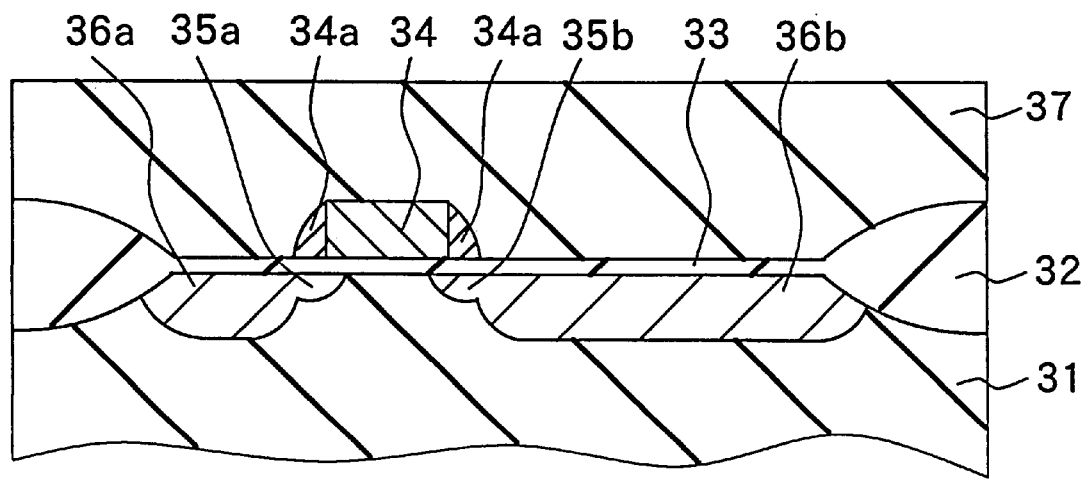
FIG. 48 is a cross section for explaining a process following FIG. 47.

As shown in FIG. 48, an interlayer insulating film 37 is formed with $SiO_2$, $Si(OC_2H_5)_4$(TEOS), or SOG (Spin On Glass) by using CVD or sputtering. After that, the surface of the interlayer insulating film 37 is planarized by CMP (Chemical and Mechanical Polishing).

Figure 49:
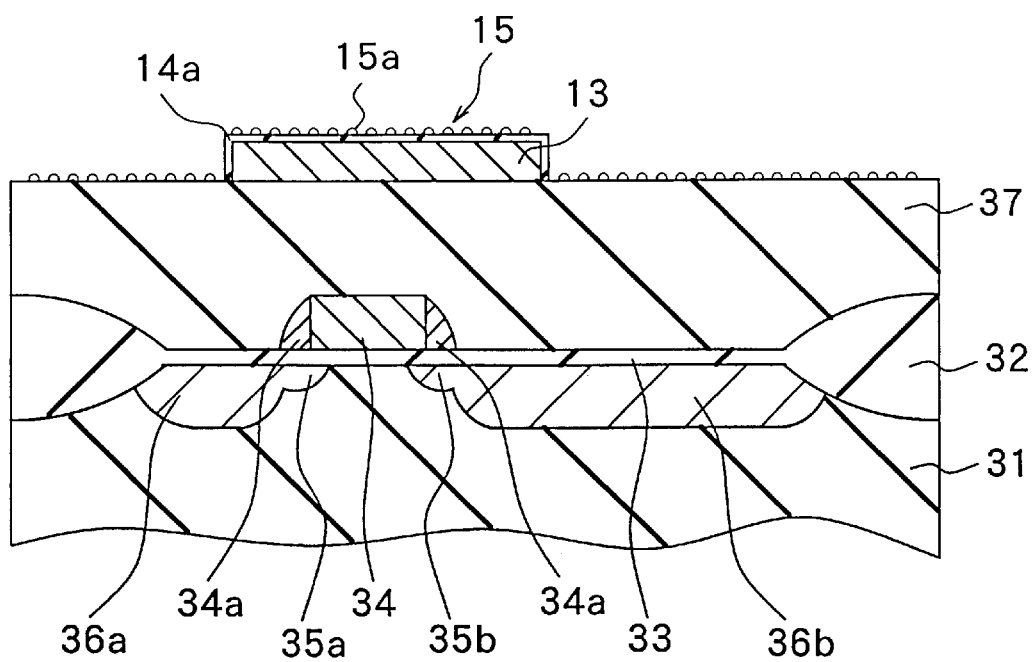
FIG. 49 is a cross section for explaining a process following FIG. 48.
Figure 50:
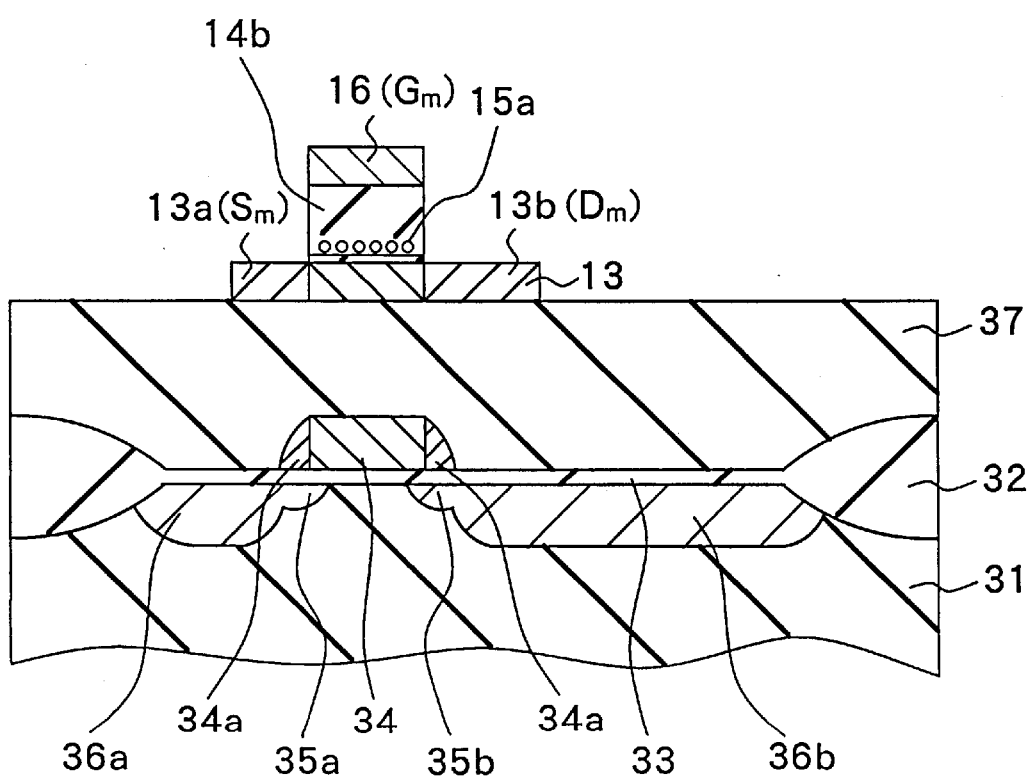
FIG. 50 is a cross section for explaining a process following FIG. 49.

After that, in a manner similar to the above-mentioned method, a memory device is formed. Specifically, as shown in FIG. 49, the tunnel insulating film 14a is formed on the interlayer insulating film 37 and the storage region 15 comprised of many particulates 15a is formed on the tunnel insulating film 14a. As illustrated in FIG. 50, the control insulating film 14b is formed and the control electrode 16 (Gm) is formed on the control insulating film 14b. After that, the control insulating film 14b and the tunnel insulating film 14a are etched until the surface of the polysilicon layer 13 by using the control electrode 16 ($G_m$) as a mask and then ion implantation is performed thereby forming the first impurity region 13a ($S_m$) and the second impurity region 13b ($D_m$). After that, necessary wiring is carried out and a protective film (not shown) made of $Si_3N_4$ or $SiO_2$ is formed on the surface of the memory unit by CVD or sputtering.

Figure 51:
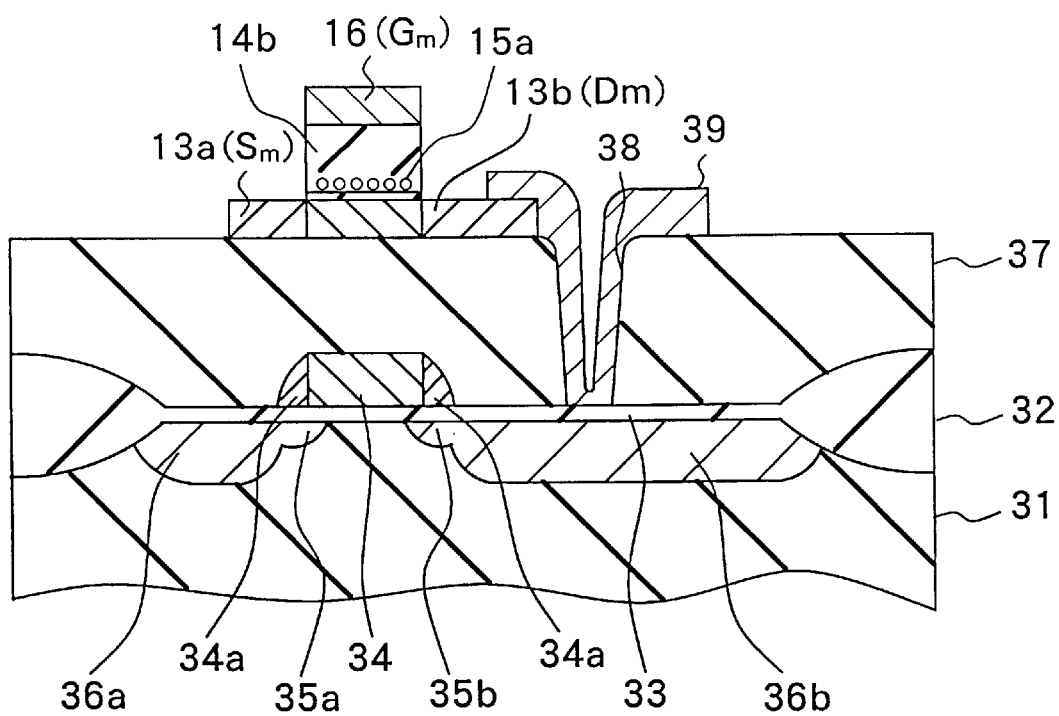
FIG. 51 is a cross section for explaining a process following FIG. 50.

Subsequently, when wiring is necessary between the memory device and the peripheral circuit, as illustrated in FIG. 51, a contact hole 38 is opened in the interlayer insulating film 37 by RIE using a mixture gas of $CH_4$ and $H_2$ or $C_2H_6$ and a wiring 39 is formed by using a metal such as Al, Cu, W. After that, by CVD or sputtering, a protective film (not shown) made of $Si_3N_4$ or $SiO_2$ is formed on the surface.

Figure 52:
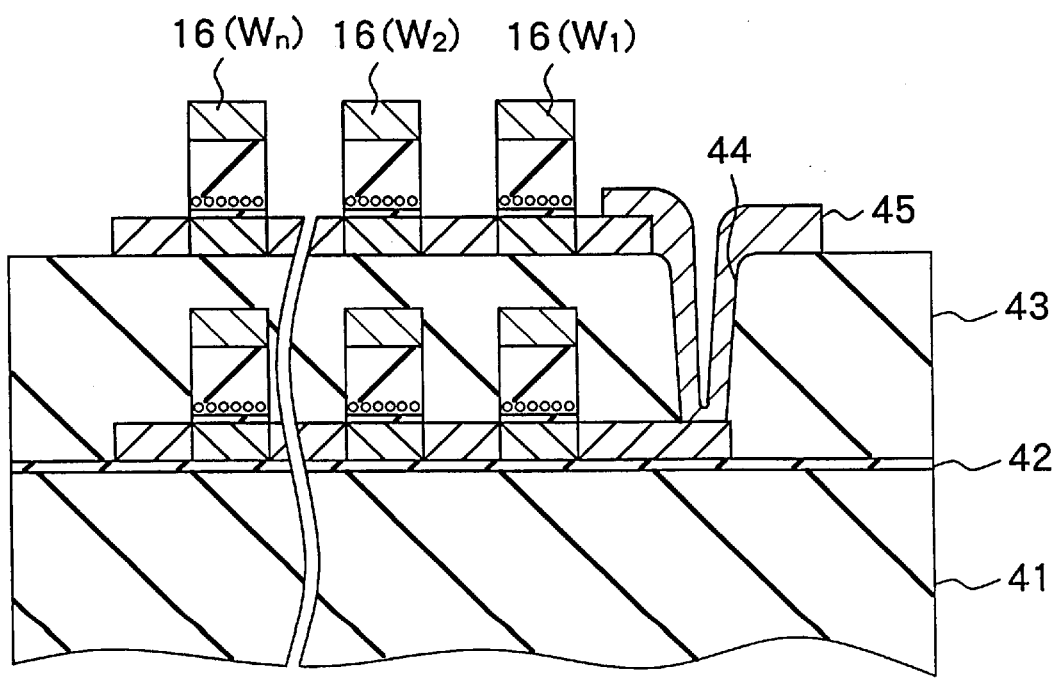
FIG. 52 is a cross section for explaining a process following FIG. 51.

FIG. 52 shows an example in which the memory device of the embodiment are formed in a stacked structure (two-layer structure in this case). To be specific, after a buffer layer 42 made of $Si_3N_4$, $SiO_2$ is formed on a semiconductor substrate 41, the memory device according to the embodiment is fabricated, and after that, by using CVD or sputtering, an interlayer insulating film 43 is formed by using $SiO_2$, $Si(OC_2H_5)_4$(TEOS), or SOG (Spin On Glass). After that, the surface of the interlayer insulating film 43 is planarized by CMP, and while the memory device in the second layer is fabricated, a contact hole 44 is opened in the interlayer insulating film 43, and a wiring 45 is formed by depositing a metal film made of Al, Cu, W, or the like. With such a multilayer structure, a memory unit having a large capacity can be manufactured.

A concrete experiment of the invention will now be described.

Figure 53A:
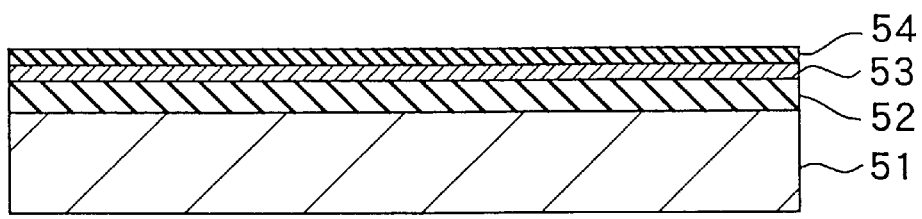
FIGS. 53A to 53C are cross sections of respective processes for explaining an experiment of the invention.

First, as illustrated in FIG. 53A, an $SiO_2$ film 52 having a thickness of 200 nm was deposited on a glass substrate 51 by PECVD. In place of the $SiO_2$ film, a $Si_{1-x}N_x$ (x=0 to 4/3) film may be formed. As a substrate, besides the glass substrate, a plastic substrate made of, for example, polyether sulfone (PES), polymethyl methacrylate (PMMA), or polyethylene terephthalate (PET), or a silicon wafer, or the like may be used. Subsequently, a Si film 53 having a thickness of 30 nm was deposited on the $SiO_2$ film 52 by PECVD. The Si film 53 may be in an amorphous state or a microcrystal state.

On the Si film 53, an $SiO_x$ (x<2) (silicon nitride) film 54 of a nonstoichiometric composition containing excessive Si was formed by PECVD using an SiH4 gas, having the flow rate of 20 SCCM, and an N2O gas, having the flow rate of 20 SCCM.

Figure 53B:
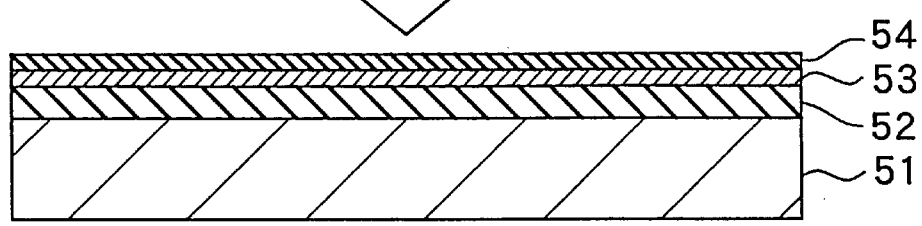

As shown in FIG. 53B, the surface of the glass substrate 51 on which the $SiO_x$ film 54 was formed was irradiated with a laser beam 16 of 280 $mJ/cm^2$ having the pulse width of 10 to 50 nsec. As a laser, an excimer laser of KrF (resonant wavelength of 248 nm), ArF (resonant wavelength of 193 nm), XeCl (resonant wavelength of 308 nm) or the like may be used. In this case, the XeCl excimer laser was used.

Figure 53C:
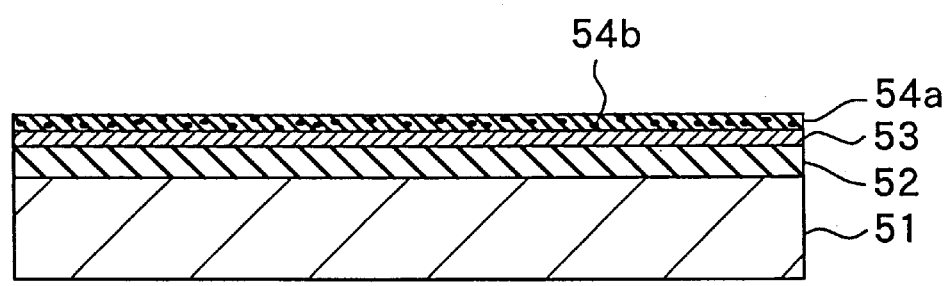

By the irradiation of the energy beam, as shown in FIG. 53C, the $SiO_x$ film 54 was decomposed into $SiO_2$ and Si of the stoichiometric compositions. That is, more than one particulates 54b of Si was formed in a $SiO_2$ film 54a. The size of the particulate 54b lay within the range from 1 nm to 1 $\mu$m.

Figure 54:
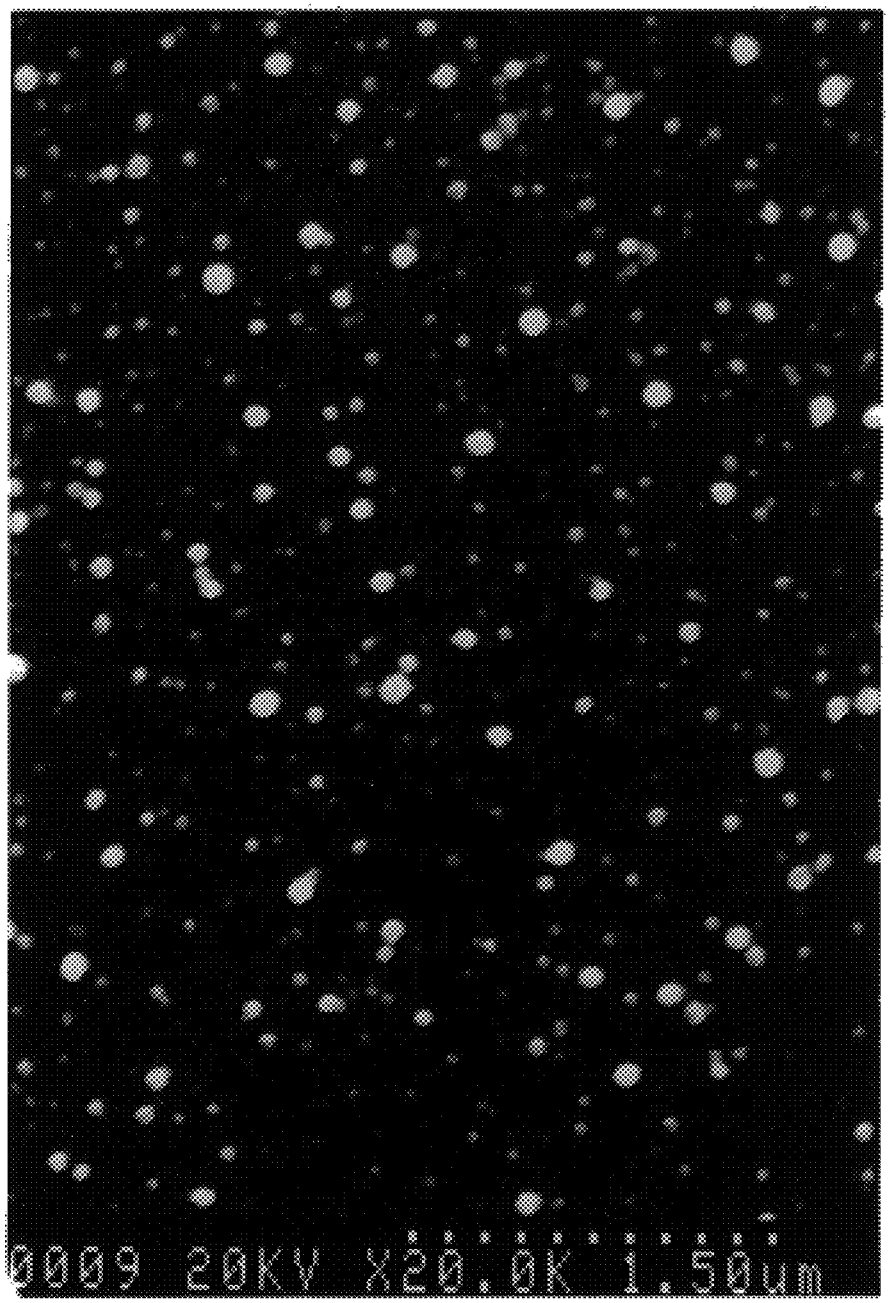
FIG. 54 is an SEM photograph for explaining a state of the formation of silicon dots (particulates).

FIG. 54 shows the result of an SEM (Scanning Electron Microscope) photograph after the irradiation of the energy beam and it is visible that white bright dots are scattered in a black region. Further, as a result of examination of the difference between the dark region, which is considered as $SiO_2$, and the light region, which is considered as spread Si by micro AES (Auger Electron Spectroscopy), it was found that Si was concentrated in the light region more than the dark region.

As mentioned above, the $SiO_x$ film 54 containing excessive Si was formed on the Si film 53 deposited on the glass substrate 51. Subsequently, heat treatment was performed by irradiating the $SiO_x$ film 54 with the laser beam 55, thereby enabling the storage region comprising many particulates 54b to be formed.

An example of manufacturing a memory device will now be concretely described making reference to FIGS. 55A to 56B.

Figure 55A:
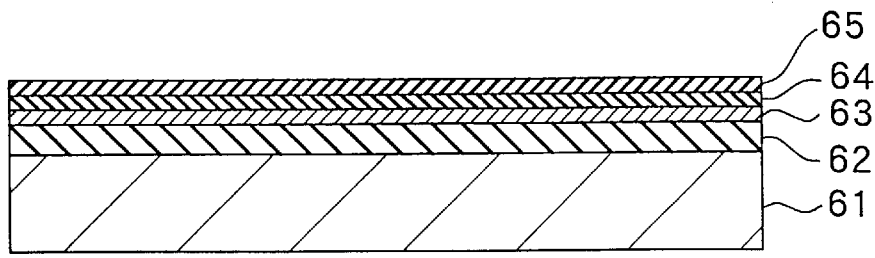
FIGS. 55A to 55D are cross sections of respective processes for explaining a process of manufacturing a silicon dot memory.

First, as illustrated in FIG. 55A, a $SiO_2$ film 62 having a thickness of 200 nm was formed on a glass substrate 61 by PECVD. Subsequently, a Si film 63 for a memory channel having a thickness of 30 nm was formed on the $SiO_2$ film 62. On the Si film 63, an $SiO_2$ film 64 having a thickness of 1 nm to 10 nm was formed by PECVD. On the $SiO_2$ film 64, a $SiO_x$ (x<2) film 65 containing excessive Si was formed by PECVD using the $SiH_4$ gas, having the flow rate of 20 SCCM, and the $N_2O$ gas having the flow rate of 20 SCCM.

Figure 55B:
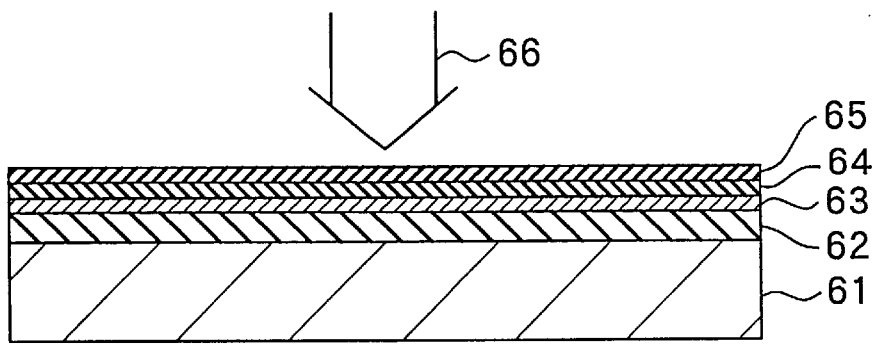
Figure 55C:
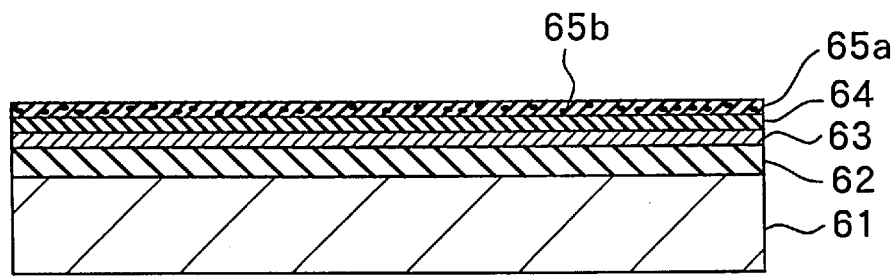

As shown in FIG. 55B, the surface of the glass substrate 61 on which the $SiO_x$ film 65 was formed was irradiated with an excimer laser beam 66 of 280 $mJ/cm^2$. By the irradiation of the laser beam 66, as shown in FIG. 55C, the $SiO_x$ film 65 was decomposed into a $SiO_2$ film 65a and Si particulates 65b dispersed in the $SiO_2$ film 65a. The $SiO_2$ film 65a in which the particulates 65b are dispersed becomes a floating gate.

Figure 55D:
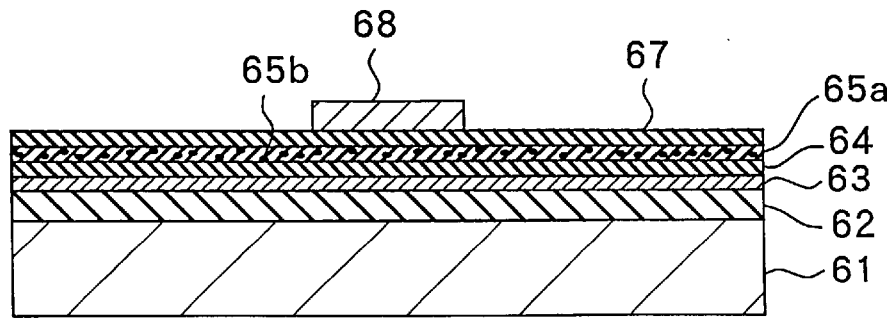

After forming of the particulates 65b, as illustrated in FIG. 55D, a $SiO_2$ film 67 having a thickness of 100 nm was deposited on the $SiO_2$ film 65a by PECVD. Subsequently, a control gate 68 made of Ta (tantalum) having a film thickness of 100 nm was formed on the $SiO_2$ film 67. More specifically, the tantalum film was formed on the $SiO_2$ film 67 by, for example, sputtering, and after that, a photoresist film of a gate pattern was formed on the tantalum film, the tantalum film was etched using the photoresist film as a mask, and the photoresist film was peeled off, thereby forming the control gate 68.

Figure 56A:
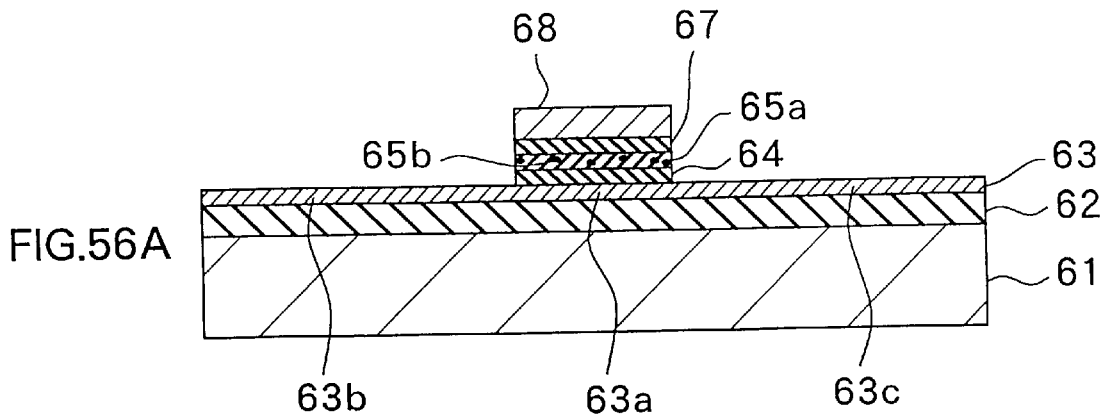
FIGS. 56A and 56B are cross sections of respective processes following FIG. 55D.

As illustrated in FIG. 56A, for example, by plasma etching using a mixture gas containing $CF_4$ and $H_2$, the $SiO_2$ film 67, the $SiO_2$ film 65 containing the particulates 65b, and the $SiO_2$ film 64 were sequentially selectively etched using the control gate 68 as a mask. Subsequently, an n-type impurity (phosphorus (P)) was introduced into the Si film 63 by plasma doping using plasma of $PH_3$ at a low temperature of 90∨ C. using the control gate 68 as a mask. By the operation, a first impurity region 63b and a second impurity region 63c were formed in a self-aligned manner on both sides of a conduction region 63a under the control gate 68. Then the surface of the substrate was irradiated with the excimer laser beam (wavelength 308 nm), thereby activating the impurities in the first impurity region 63b and the second impurity region 63c.

Figure 56B:
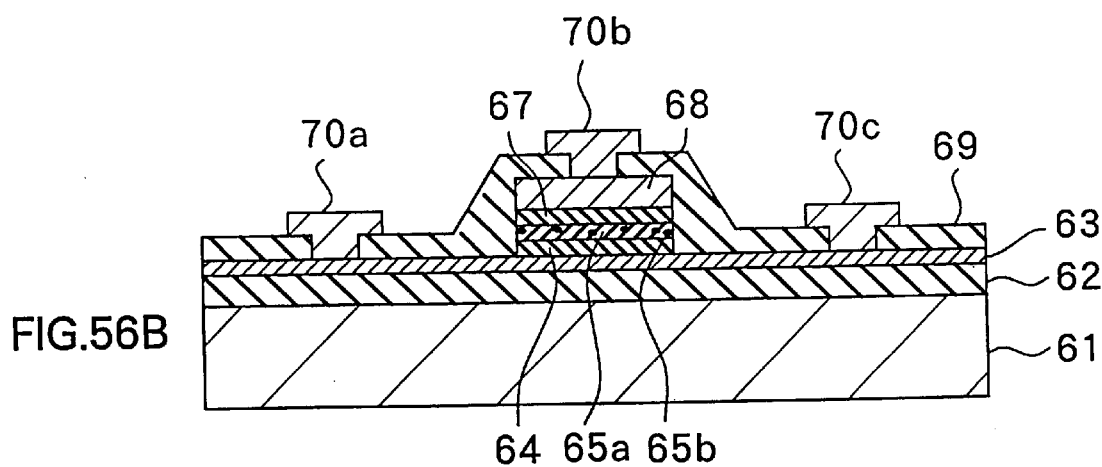

Subsequently, as shown in FIG. 56B, an $Si_3N_4$ film 69 as a protective film was formed on the surface of the substrate by, for example, PECVD, and after that contact holes for a source, a gate, and a drain are opened in the $Si_3N_4$ film 69, aluminum (Al) was deposited by, for example, sputtering, and then patterning was performed, thereby forming a source electrode 70a, a gate electrode 70b, and a drain electrode 70c.

By the above method, the non-volatile memory device having the floating gate (storage region) in which Si particulates were contained was fabricated. In the memory device, when a large, positive bias with respect to the conduction region 63a is applied to the gate electrode 70b in a state, where a current is passed between the first and second impurity regions 63b and 63c, electrons tunneled the insulating film are stored in the Si dots 65b and the I–V characteristics are accordingly changed. When a negative bias is applied to the gate electrode 60b, the electrons stored in the Si dots 65b tunnel the insulating film and are released into the conduction region 63a. As a result, the original I–V characteristics are obtained. By forming the Si dots 65b in the gate insulating film as described above, the charges are stored or released and the memory effect can be produced.

The structure has the same action as that of what is called a flash memory having a continuous Si floating gate. Since the floating gate are in the state of dots, the ratio of leakage and dissipation of the charges stored in each dot is low, enabling the memory unit to have an excellent holding performance.

Although the invention has been described by the embodiments, the invention is not limited to the embodiments. For instance, the example in which the invention is applied to the manufacture of the silicon dot memory has been described as the embodiments, as long as the particulates (dots) of silicon are used, the invention can also be applied to manufacture of other various devices. For example, when a silicon substrate is used as a substrate, the invention can be applied to a flash memory having the floating gate.

Although the case of forming Si dots has been described as the embodiments, dots of other semiconductors may also be formed. For example, Ge (germanium) as another Group IV element, and $SiFe_2$ and SiGe as Group IV compound semiconductors may also be used. Further, dots made of a Group II–VI compound semiconductor or a Group III–V compound semiconductor, or dots made of a metal (Au, Sb, Sn) may also be formed.

As examples of forming dots using a Group II–VI compound semiconductor, an example of forming ZnSe dots by irradiating ZnO to which Se is added (or stacked structure of ZnO/ZnSe/ZnO) with a laser beam, and an example of forming ZnTe dots by using Te (tellurium) in place of Se in the above example may be mentioned. As examples of forming dots by using a Group III–V compound semiconductor, an example of forming GaN dots in $Si_3N_4$ by irradiating SiNx to which Ga is added (or a stacked structure of $Si_3N_4$/GaN/$Si_3N_4$) with a laser beam, and further an example of forming InAs dots in AlGaAs by irradiating a stacked structure of AlGaAs/InAs/AlGaAs with a laser beam may be mentioned.

As described above, according to the memory device, the method of manufacturing the memory device, or the integrated circuit of the invention, while the storage region comprises a number of dispersed particulates (dots), the surface density of the particulates in the storage region is set to be higher than the surface density of the structural holes (pin holes) produced in the tunnel insulating film or the number of particulates in the storage region is set to five or more. Alternatively, while the conduction region is formed by the polysilicon film having the surface roughness of 0.1 nm to 10 nm, the number of particulates in the storage region is set to be larger than that of crystal grains in the conduction region. Accordingly the tunnel insulating film can be manufactured at a low temperature on the substrate made of glass or plastic. Even when a defect such as a pin hole occurs in the tunnel insulating film and the charges stored in a part of particulates leak, the charges stored in the particulates formed in the region where no defects exist don't leaked. The information can be therefore held for a long time.

According to the method of manufacturing the semiconductor device of the invention, the heat treatment such as irradiation of an energy beam is performed to the film for forming the storage region of the nonstoichiometric composition containing a semiconductor excessively, so that the storage region having many dispersed particulates can be easily formed also on the substrate made of glass or plastic.

As mentioned above, since the tunnel insulating film can be manufactured at a low temperature on a substrate made of glass or plastic and also information can be held for a long time, the memory device according to the invention is suitable for use in a non-volatile storage device and a data processing apparatus.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A memory device comprising:
   a conduction region made of a polycrystalline semiconductor;
   a first impurity region adjacent to the conduction region;
   a second impurity region apart from the first impurity region and adjacent to the conduction region;
   a storage region having a plurality of dispersed particulate, for storing charges moved from the conduction region;
   a tunnel insulating film between the storage region and the conduction region, through which charges can pass;
   a control electrode for controlling each of a charge quantity of the storage region and conductivity of the conduction region;
   a control insulating film between the control electrode and the storage region; and
   surface density of the particulate in the storage region being higher than a surface density of structural holes that occur in the tunnel insulating film.

2. The memory device according to claim 1, wherein each of the conduction region, the first impurity region, and the second impurity region is mead of a non-single crystal semiconductor.

3. The memory device according to claim 2, wherein each of the conduction region, the first impurity region, and the second impurity region is mead of a non-single crystal $Si_xGe_{1-x}$ where $0 \leq x \leq 1$.

4. The memory device according to claim 3, wherein each of the conduction region, the first impurity region, and the second impurity region is mead of polysilicon $Si_xGe_{1-x}$ where $0 \leq x \leq 1$.

5. The memory device according to claim 3, wherein each of the conduction region, the first impurity region, and the second impurity region is made of amorphous $Si_xGe_{1-x}$ where $0 \leq x \leq 1$.

6. The memory device according to claim 1, wherein an insulating substrate is a substrate part, and each of the conduction region, the first impurity region, and the second impurity region is on one surface of the insulating substrate.

7. The memory device according to claim 1, wherein an insulating substrate is a substrate part and the control electrode is located on one surface of the insulating substrate.

8. The memory device according to claim 6, wherein the insulating substrate is made of one of quartz, glass, or plastic.

9. The memory device according to claim 7, wherein one of an $SiN_x$ film, an $SiO_2$ film, a stacked film of $SiN_x$ and $SiO_2$, or an $SiN_kO_1$, where k, 1≠0, film is formed as a buffer layer between the insulating substrate and each of the conduction region, the first impurity region, and the second impurity region.

10. The memory device according to claim 1, wherein the storage region is made by one of an aggregate of particulates of $Si_yGe_{1-y}$ where $0 \leq y \leq 1$, or an aggregate of metal particulates.

11. The memory device according to claim 1, wherein the control electrode is made of non-polycrystalline Si containing an impurity or of a metal.

12. The memory device according to claim 1, wherein the control insulating film is made of one of $SiO_2$, $Si_3N_4$, or $SiN_kO_1$ where k, 1≠0.

13. The memory device according to claim 1, wherein a thickness of a material of the conduction region is one of 0.1 µm or is less than 0.1 µm.

14. A memory device comprising:
a conduction region made of a polycrystalline semiconductor;
a first impurity region adjacent to the conduction region;
a second impurity region apart from the first impurity region and adjacent to the conduction region;
a storage region having a plurality of dispersed particulate, for storing charges moved from the conduction region;
a tunnel insulating film between the storage region and the conduction region, through which charges can pass;
a control electrode for controlling each of a charge quantity of the storage region and conductivity of the conduction region;
a control insulating film between the control electrode and the storage region; and
a number of the particulate in the storage region is at least five.

15. A memory device comprising:
a conduction region made of a semiconductor;
a first impurity region adjacent to the conduction region;
a second impurity region apart from the first impurity region and adjacent to the conduction region;
a storage region having a plurality of dispersed particulate, for storing charges moved from the conduction region;
a tunnel insulating film between the storage region and the conduction region, through which charges can pass;
a control electrode for controlling each of a charge quantity of the storage region and conductivity of the conduction region; and
a control insulating film between the control electrode and the storage region,
the conduction region being formed by a polysilicon film having a surface roughness of 0.1 nm to 100 nm and a number of particulate in the storage region being larger than a number of crystal grains in the conduction region.

16. The memory device according to claim 1, wherein while information is written by applying a potential, higher than a potential applied to the first impurity region, to the control electrode, information is erased by applying a potential lower than a potential applied to the first impurity region, to the control electrode, and wherein information is held by one of setting the potential of all electrodes, i.e. the control electrode and the electrodes of the first and the second impurity regions, to a common potential, or obtaining a floating state.

17. The memory device according to claim 16, wherein information is read out by detecting a change in charge quantity in the storage region caused by the writing of the information, based on one of a change in conductivity of the conduction region or current value with respect to the potential of the control electrode.

18. The memory device according to claim 1, wherein information is written by applying a potential, lower than a potential applied to the first impurity region, to the control electrode, wherein information is erased by applying a potential, higher than a potential applied to the first impurity region, to the control electrode, and wherein information is held by one of setting the potential of all electrodes, i.e. the control electrode and the electrodes of the first and the second impurity regions, to a common potential, or by obtaining a floating state.

19. The memory device according to claim 18, wherein information is read out by detecting a change in charge quantity in the storage region caused by the writing of the information, based on one of a change in conductivity of the conduction region or current value with respect to the potential of the control electrode.

20. An integrated circuit in which a plurality of memory device are integrated, each of the memory device comprising:
a conduction region made of a semiconductor;
a source region adjacent to the conduction region;
a drain region apart from the source region and adjacent to the conduction region;
a storage region having a plurality of dispersed particulate, for storing charges moved from the conduction region;
a tunnel insulating film between the storage region and the conduction region, through which charges can be moved;
a control electrode for controlling a charge quantity of the storage region and the conductivity of the conduction region; and a control insulating film between the control electrode and the storage region, the film having a structure such that a surface density of the particulate in the storage region is higher than a surface density of structural holes that occur in the tunnel insulating film; and
the control electrode of each of the memory device connected to a word line, and a source-drain path of each memory device connected between a bit line and a source line.

21. A method of manufacturing a memory device, comprising:
forming a conduction region by a semiconductor film on a substrate made of an insulating material;
forming a tunnel insulating film on the conduction region;
forming a storage region having a plurality of particulates dispersed on the tunnel insulating film, with a surface density of the particulates being higher than a surface of structural holes in the tunnel insulating film;
forming a control insulating film on the storage region;
forming a control electrode on the control insulating film; and
forming a first impurity region adjacent to the conduction region and a second impurity region apart from the first impurity region and adjacent to the conduction region.

22. The method of manufacturing a memory device according to claim 21, wherein a surface of the conduction region is exposed to an ionized gas containing at least one of an oxygen atom and a nitrogen atom, thereby forming the tunnel insulating film.

23. The method of manufacturing a memory device according to claim 22, wherein, after formation of the tunnel insulating film, the surface of the conduction region is heated.

24. The method of manufacturing a memory device according to claim 23, wherein the surface of the conduction region is heated by being irradiated with an energy beam.

25. The method of manufacturing a memory device according to claim 21, wherein the storage region is formed by one of chemical vapor deposition, sputtering, or evaporation so as to cover a surface of the tunnel insulating film at a coverage factor smaller than 1.

26. The method of manufacturing a memory device according to claim 21, wherein a film for forming the storage region of a nonstoichiometric composition, excessively containing a semiconductor element, is formed on the conduction region and, by heating the film for forming the storage region, the tunnel insulating film and the storage region are formed.

27. The method of manufacturing a memory device according to claim 26, wherein the film for forming the storage region is heated by being irradiated with an energy beam.

28. A method of manufacturing a memory device, comprising:
    forming a conduction region made by a polycrystalline semiconductor film on a substrate made of an insulating material;
    forming a tunnel insulating film on the conduction region;
    forming a storage region having at least five particulate dispersed on the tunnel insulating film;
    forming a control insulating film on the storage region;
    forming a control electrode on the control insulating film; and
    forming a first impurity region adjacent to the conduction region and a second impurity region apart from the first impurity region and adjacent to the conduction region.

29. A method of manufacturing a memory device, comprising:
    forming a conduction region, made by a polysilicon film whose surface roughness is in a range of 0.1 nm to 100 nm, on a substrate made of an insulating material;
    forming a tunnel insulating film on the conduction region;
    forming a storage region having dispersed particulate, a number of which is larger than a number of crystal grains in the conduction region, on the tunnel insulating film;
    forming a control insulating film on the storage region;
    forming a control electrode on the control insulating film; and
    forming a first impurity region adjacent to the conduction region and a second impurity region apart from the first impurity region and adjacent to the conduction region.

30. A method of manufacturing a memory device, comprising:
    forming a control electrode on a substrate made of an insulating material;
    forming a control insulating film on the control electrode;
    forming a storage region having a plurality of dispersed particulate on the control insulating film, with a surface density of the particulate being higher than a surface density of structural holes in the tunnel insulating film;
    forming a tunnel insulating film on the storage region;
    forming a conduction region made of a semiconductor on the tunnel insulating film; and
    forming a first impurity region adjacent to the conduction region and a second impurity region apart from the first impurity region and adjacent to the conduction region.

31. A method of manufacturing a memory device, comprising:
    forming a control electrode on a substrate made of an insulating material;
    forming a control insulating film on the control electrode;
    forming a storage region having at least five dispersed particulate on the control insulating film;
    forming a tunnel insulating film on the storage region;
    forming a conduction region made of a polycrystalline semiconductor on the tunnel insulating film; and
    forming a first impurity region adjacent to the conduction region and a second impurity region apart from the first impurity region and adjacent to the conduction region.

32. A method of manufacturing a memory device, comprising:
    forming a control electrode on a substrate made of an insulating material;
    forming a control insulating film on the control electrode;
    forming a storage region, having a plurality of dispersed particulate, on the control insulating film;
    forming a tunnel insulating film on the storage region;
    forming a conduction region made of a semiconductor on the tunnel insulating film;
    forming a first impurity region adjacent to the conduction region and a second impurity region apart from the first impurity region and adjacent to the conduction region; and
    the conduction region being formed by a polysilicon film having a surface roughness in the range of 0.1 nm to 100 nm and wherein a number of particulate in the storage region is larger than a number of crystal grains in the conduction region.

33. A method of manufacturing a semiconductor device, comprising:
    forming a semiconductor film on a substrate and, thereafter, forming a film for forming a storage region, of a nonstoichiometric composition excessively containing a semiconductor element, on the semiconductor film; and
    forming a storage region by dispersing particulate of a semiconductor, in the film for forming a storage region, by performing heat treatment.

34. The method of manufacturing a semiconductor device according to claim 33, wherein the film for forming a storage region is one of an oxide film or a nitride film containing excessive semiconductor.

35. The method of manufacturing a semiconductor device according to claim 33, wherein the semiconductor is one of Si, Ge, $SiFe_2$, SiGe, a Group II–VI compound semiconductor, or a Group III–V compound semiconductor.

36. The method of manufacturing a semiconductor device according to claim 33, wherein heat treatment is performed by irradiating an energy beam.

37. The method of manufacturing a semiconductor device according to claim 36, wherein the energy beam is irradiated by an excimer laser.

38. The method of manufacturing a semiconductor device according to claim 33, wherein an insulating film is formed between the substrate and the semiconductor film.

* * * * *